(12) United States Patent  
Sel et al.

(10) Patent No.: US 7,884,425 B2
(45) Date of Patent: Feb. 8, 2011

(54) NON-VOLATILE MEMORY DEVICES

(75) Inventors: Jong-Sun Sel, Kyungki-Do (KR);
Jung-Dal Choi, Kyungki-Do (KR);
Choong-Ho Lee, Kyungki-Do (KR);
Ju-Hyuck Chung, Kyungki-Do (KR);
Hee-Soo Kang, Gyeonggi-do (KR);
Dong-uk Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 12/257,939

(22) Filed: Oct. 24, 2008

(65) Prior Publication Data

US 2009/0127633 A1 May 21, 2009

(30) Foreign Application Priority Data

Nov. 16, 2007 (KR) ...................... 10-2007-0117390

(51) Int. Cl.
*H01L 21/70* (2006.01)
(52) U.S. Cl. .................................. 257/390; 257/E27.06
(58) Field of Classification Search ................. 257/390, 257/E27.06
See application file for complete search history.

(56) References Cited

U.S. PATENT DOCUMENTS

| 5,473,563 | A | 12/1995 | Suh et al. |
| 6,037,668 | A * | 3/2000 | Cave et al. ................. 257/784 |
| 6,044,016 | A | 3/2000 | Itoh |
| 6,845,030 | B2 | 1/2005 | Kang et al. |
| 6,873,007 | B2 | 3/2005 | Sugita et al. |
| 7,042,770 | B2 | 5/2006 | Lee et al. |
| 7,253,467 | B2 | 8/2007 | Lee et al. |
| 7,400,028 | B2 * | 7/2008 | Tomita ........................ 257/620 |
| 2003/0151109 | A1 * | 8/2003 | Taniguchi et al. ........... 257/500 |
| 2006/0180851 | A1 | 8/2006 | Lee et al. |
| 2006/0270212 | A1 | 11/2006 | Jung et al. |

FOREIGN PATENT DOCUMENTS

| JP | 08-064700 | 3/1996 |
| JP | 11-312754 | 11/1999 |
| JP | 2003-282735 | 10/2003 |

(Continued)

*Primary Examiner*—Bradley K Smith
*Assistant Examiner*—Mohammad T Karimy
(74) *Attorney, Agent, or Firm*—Myers Bigel Sibley & Sajovec, P.A.

(57) ABSTRACT

In one embodiment, a semiconductor memory device includes a substrate having first and second active regions. The first active region includes a first source and drain regions and the second active region includes a second source and drain regions. A first interlayer dielectric is located over the substrate. A first conductive structure extends through the first interlayer dielectric. A first bit line is on the first interlayer dielectric. A second interlayer dielectric is on the first interlayer dielectric. A contact hole extends through the second and first interlayer dielectrics. The device includes a second conductive structure within the contact hole and extending through the first and second interlayer dielectrics. A second bit line is on the second interlayer dielectric. A width of the contact hole at a bottom of the second interlayer dielectric is less than or substantially equal to a width at a top of the second interlayer dielectric.

19 Claims, 33 Drawing Sheets

FOREIGN PATENT DOCUMENTS

| | | |
|---|---|---|
| JP | 2006-332664 | 12/2006 |
| KR | 10-0632656 | 9/2006 |
| KR | 100632656 B1 | 9/2006 |
| KR | 10-2007-0036525 | 4/2007 |
| KR | 1020070036525 A | 4/2007 |

* cited by examiner

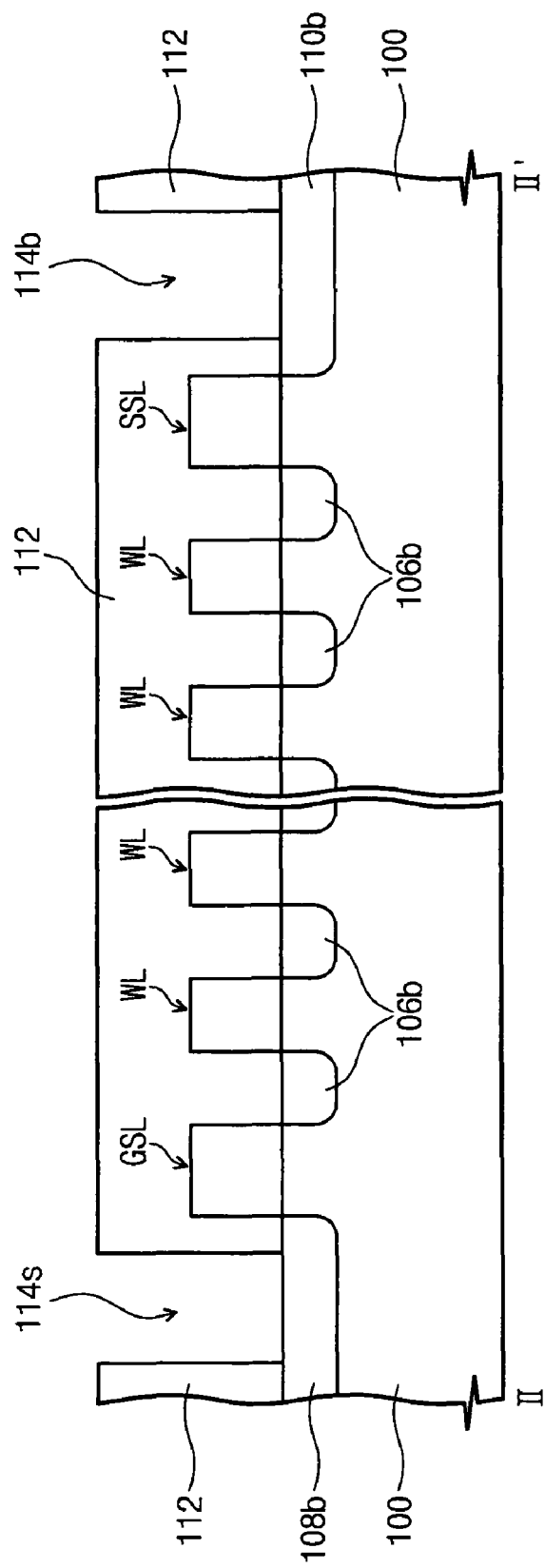

NON-VOLATILE MEMORY DEVICES

CROSS-REFERENCE TO RELATED PATENT APPLICATION

This application claims priority under 35 USC §119 to Korean Patent Application No. 2007-0117390 filed on Nov. 16, 2007 in the Korean Intellectual Property Office, the disclosure of which is incorporated herein in its entirety by reference.

BACKGROUND

Exemplary embodiments of the present invention relate generally to semiconductor devices and methods of fabricating the same. More particularly, exemplary embodiments of the present invention relate to semiconductor memory devices having reduced coupling capacitance between bit lines, and methods of manufacturing the same.

SUMMARY

One embodiment exemplarily described herein can be characterized as a semiconductor memory device that includes a device isolation pattern on a substrate defining a first active region and a second active region. The first active region may include a first source region, a plurality of first source/drain regions and a first drain region. The second active region may include a second source region, a plurality of second source/drain regions and a second drain region. The semiconductor memory device may also include an insulation layer overlying the first active region and the second active region; a common source line extending through the insulation layer and electrically connected to the first source region and the second source region; a first landing plug extending through the insulation layer and electrically connected to the first drain region; a second landing plug extending through the insulation layer and electrically connected to the second drain region; a first bit line located over the insulation layer and electrically connected to the first landing plug; and a second bit line located over the insulation layer and electrically connected to the second landing plug. A top surface of at least one of the first landing plug and the second landing plug may be substantially coplanar with a top surface of the common source line. The first bit line and the second bit line may be located at different heights above the substrate.

Another embodiment exemplarily described herein can be characterized as a semiconductor memory device that includes a device isolation pattern on a substrate defining a first active region and a second active region. The first active region may include a first source region and a first drain region and the second active region may include a second source region and a second drain region. The semiconductor memory device may also include a first interlayer dielectric located over the first active region and the second active region; a first conductive structure extending through the first interlayer dielectric and electrically connected to the first drain region; a first bit line located on the first interlayer dielectric and electrically connected to the first conductive structure; and a second interlayer dielectric located on the first interlayer dielectric. The second interlayer dielectric may include a contact hole extending through the second interlayer dielectric and the first interlayer dielectric. The semiconductor memory device may also include a second conductive structure disposed within the contact hole and extending through the first interlayer dielectric and the second interlayer dielectric. The second conductive structure may be electrically connected to the second drain region. The semiconductor memory device may also include a second bit line located on the second interlayer dielectric and electrically connected to the second conductive structure. A width of the contact hole at a bottom surface of the second interlayer dielectric may be less than or substantially equal to a width of the contact hole at a top surface of the second interlayer dielectric.

Yet another embodiment exemplarily described herein can be characterized as a method of forming a semiconductor memory device. The method may include forming a device isolation pattern on a substrate to define a first active region and a second active region, wherein the first active region includes a first source region and a first drain region and wherein the second active region includes a second source region and a second drain region; forming a first interlayer dielectric on the first active region and the second active region; forming a first conductive structure extending through the first interlayer dielectric and electrically connected to the first drain region; forming a first bit line on the first interlayer dielectric, wherein the first bit line is electrically connected to the first conductive structure; forming a second interlayer dielectric on the first interlayer dielectric; removing a portion of the second interlayer dielectric to form a contact hole extending therethrough; forming a second conductive structure extending through the contact hole and the first interlayer dielectric, wherein the second conductive structure is electrically connected to the second drain region; and forming a second bit line located on the second interlayer dielectric, wherein the second bit line is electrically connected to the second conductive structure.

Still another embodiment exemplarily described herein can be characterized as a method of forming a semiconductor memory device. The method may include forming a device isolation pattern on a substrate to define a first active region and a second active region, wherein the first active region includes a first source region and a first drain region and wherein the second active region includes a second source region and a second drain region; forming an insulation layer overlying the first active region and the second active region; forming a common source line extending through the insulation layer and electrically connected to the first source region and the second source region; forming a first landing plug extending through the insulation layer, wherein the first landing plug is electrically connected to the first drain region; forming a second landing plug extending through the insulation layer, wherein the second landing plug is electrically connected to the second drain region; forming a first bit line over the insulation layer, wherein the first bit line is electrically connected to the first landing plug; and forming a second bit line over the insulation layer, wherein the second bit line is electrically connected to the second landing plug, wherein a top surface of at least one of the first landing plug and the second landing plug is substantially coplanar with a top surface of the common source line and a top surface of the insulation layer, and wherein the second bit line and the first bit line are located at different heights above the substrate.

Another embodiment exemplarily described herein can be characterized as a method of forming a semiconductor memory device. The method may include forming a device isolation pattern on a substrate to define a first active region and a second active region, wherein the first active region includes a first source region and a first drain region and wherein the second active region includes a second source region and a second drain region; forming an insulation layer overlying the first active region and the second active region; simultaneously forming a source groove, a first landing hole and a second landing hole within the insulation layer, wherein the source groove exposes the first source region and the second source region, the first landing hole exposes the first drain region and the second landing hole exposes the second drain region; filling the source groove, the first landing hole and the second landing hole with conductive material to form a common source line in the source groove, a first landing plug in the first landing hole and a second landing plug in the second landing hole; forming a first bit line over the insulation layer, wherein the first bit line is electrically connected to the first landing plug; and forming a second bit line over the insulation layer, wherein the second bit line is electrically connected to the second landing plug, wherein the second bit line and the first bit line are located at different heights above the substrate.

BRIEF DESCRIPTION OF THE DRAWINGS

Hereinafter, exemplary embodiments of the present invention will be described with reference to the accompanying drawings, in which:

FIGS. 7A, 7B and 7C are cross-sectional views illustrating a method of forming the semiconductor memory device shown in FIG. 1, taken along line II-II' of FIG. 1, according to one embodiment;

DETAILED DESCRIPTION

Figure 1:
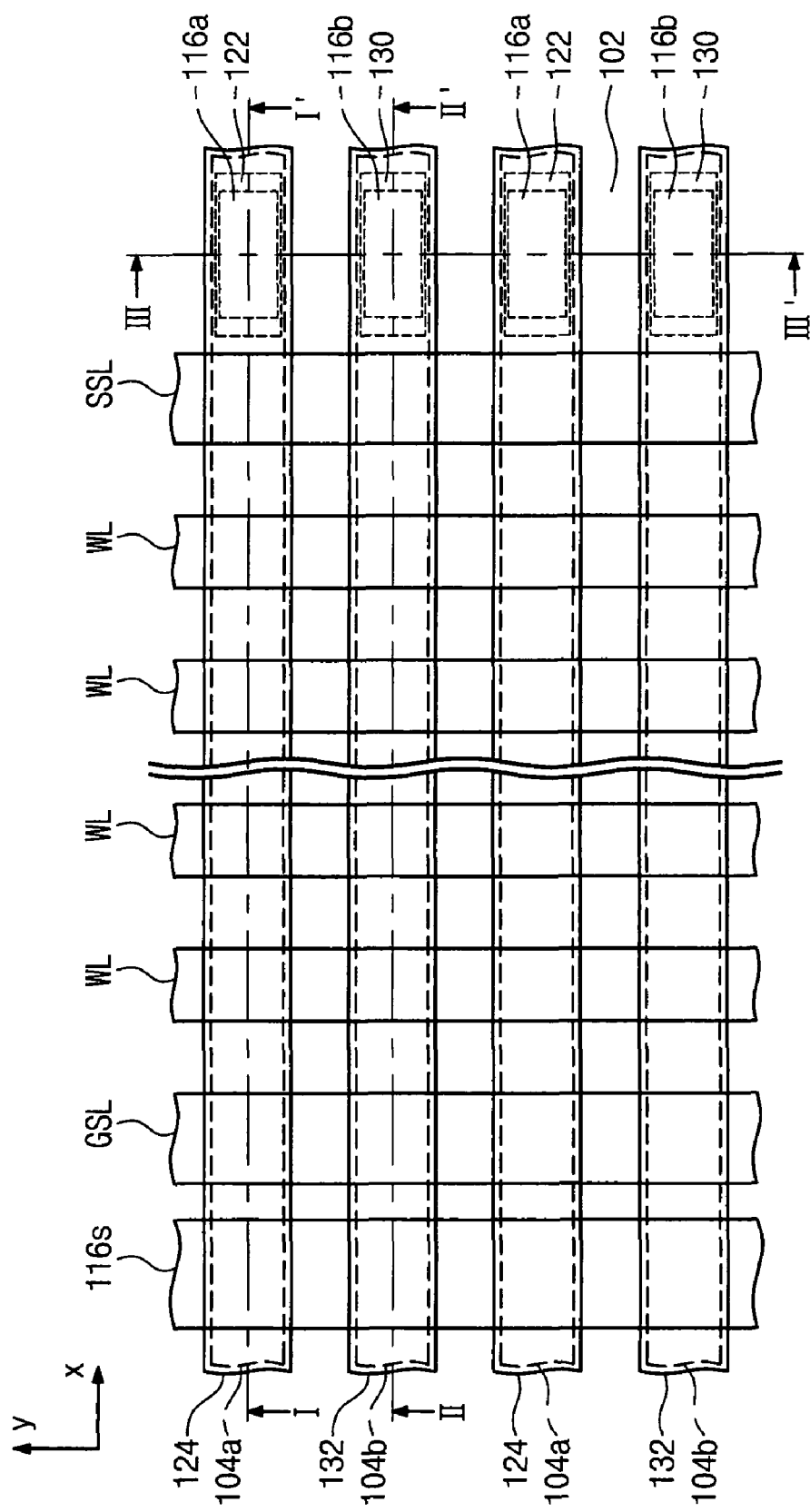
FIG. 1 is a plan view of a semiconductor memory device according to one embodiment.

Exemplary embodiments of the present invention will now be described more fully hereinafter with reference to the accompanying drawings. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Further, well-known structures and devices are not shown in order not to obscure the description of the invention with unnecessary detail.

FIG. 1 is a plan view of a semiconductor memory device according to one embodiment. Specifically, FIG. 1 illustrates a cell array region of the semiconductor memory device. The cell array region includes a plurality of memory cells (e.g., charge trap-type memory cells, conductive-type memory cells, or the like or a combination thereof). Although, not shown, the semiconductor memory device further includes a peripheral circuit region containing devices such as input/out circuits and driver circuits.

Referring to FIG. 1, a semiconductor memory device according to one embodiment may be provided as a flash memory device such as a NAND-type flash memory device. As exemplarily illustrated, the semiconductor memory device may include a device isolation pattern 102 formed on a semiconductor substrate 100 (FIG. 2A) using conventional techniques such as shallow trench isolation (STI) techniques. The device isolation pattern 102 may define a plurality of first active regions 104a and a plurality of second active regions 104b within the semiconductor substrate 100. In other words, the plurality of first active regions 104a and the plurality of second active regions 104b may be portions of the semiconductor substrate 100 surrounded by the isolation pattern 102.

The plurality of first active regions 104a and the plurality of second active regions 104b may extend substantially parallel to one another along an "x" direction and be spaced apart from one another by the device isolation pattern 102 along a "y" direction. In other words, the plurality of first active regions 104a and the plurality of second active regions 104b may be alternately arranged along the "y" direction. The plurality of first active regions 104a and the plurality of second active regions 104b may be spaced apart from each other by a substantially equal distance. In one embodiment, the "x" and "y" directions may be substantially perpendicular to each other. However, the "x" direction and the "y" direction may form an obtuse angle or acute angle.

The semiconductor memory device may further include a common source line 116s, a ground select line GSL, a plurality of word lines WL, a string select line SSL, a plurality of first cell bit lines 124 (also referred to herein as "first bit lines") and a plurality of second cell bit lines 132 (also referred to herein as "second bit lines") extending over the semiconductor substrate.

The common source line 116s, the ground select line GSL, the plurality of word lines WL and the string select line SSL may extend substantially parallel to one another along the "y" direction and be spaced apart from one another along the "x" direction. Accordingly, the common source line 116s, ground select line GSL, plurality of word lines WL and string select line SSL may cross over each of the plurality of first active regions 104a and each of the plurality of second active regions 104b.

Further, the plurality of first cell bit lines 124 and the plurality of second cell bit lines 132 may extend substantially parallel to one another along the "x" direction and be spaced apart from one another along the "y" direction. Accordingly, the plurality of first cell bit lines 124 and the plurality of second cell bit lines 132 may extend parallel with each of the plurality of first active regions 104a and each of the plurality of second active regions 104b. In one embodiment, the plurality of first cell bit lines 124 and the plurality of second cell bit lines 132 may include a material such as Ti, TiN, Ta, TaN, W, WN, Cu, Al, or the like, or compounds thereof, or any other combination thereof.

Also shown in FIG. 1 are a plurality of first cell landing plugs 116a (also referred to herein as "first landing plugs"), a plurality of second cell landing plugs 116b (also referred to herein as "second landing plugs"), a plurality of first cell contact plugs 122 (also referred to herein as "first contact plugs") and a plurality of second cell contact plugs 130 (also referred to herein as "second contact plugs").

As will be discussed in greater with respect to FIGS. 2A, 2B and 2C, each of the plurality of first cell landing plugs 116a may contact a first drain region of a corresponding one of the plurality of first active regions 104a and each of the plurality of first cell contact plugs 122 may contact a first cell landing plug 116a and a corresponding one of the plurality of first cell bit lines 124. Accordingly, a first drain region of each of the plurality of first active regions 104a can be electrically connected to a corresponding one of the plurality of first cell bit lines 124 via a "first conductive structure" including a first cell landing plug 116a and a first cell contact plug 122 electrically connected thereto.

Similarly, each of the plurality of second cell landing plugs 116b may contact a second drain region of a corresponding one of the plurality of second active regions 104b and each of the plurality of second cell contact plugs 130 may contact a second cell landing plug 116b and a corresponding one of the plurality of second cell bit lines 132. Accordingly, a second drain region of each of the plurality of second active regions 104b can be electrically connected to a corresponding one of the plurality of second cell bit lines 132 via a "second conductive structure" including a second cell landing plug 116b and a second cell contact plug 130 electrically connected thereto as will be described further.

In one embodiment, each of the plurality of first conductive structures may be substantially aligned with each of the plurality of second conductive structures along the "y" direction. Accordingly, a virtual line extending along the "y" direction may conceptually bifurcate the first and second conductive structures at substantially middle portions thereof.

The plurality of first cell landing plugs 116a and the plurality of second cell landing plugs 116b may include a material such as doped polysilicon, Ti, TiN, Ta, TaN, W, WN, Cu, Al, or the like, or compounds thereof, or any other combination thereof. In one embodiment, the plurality of first cell contact plugs 122 and the plurality of second cell contact plugs 130 may include a material such as Ti, TiN, Ta, TaN, W, WN, Cu, Al, or the like, or compounds thereof, or any other combination thereof.

Figure 2A:
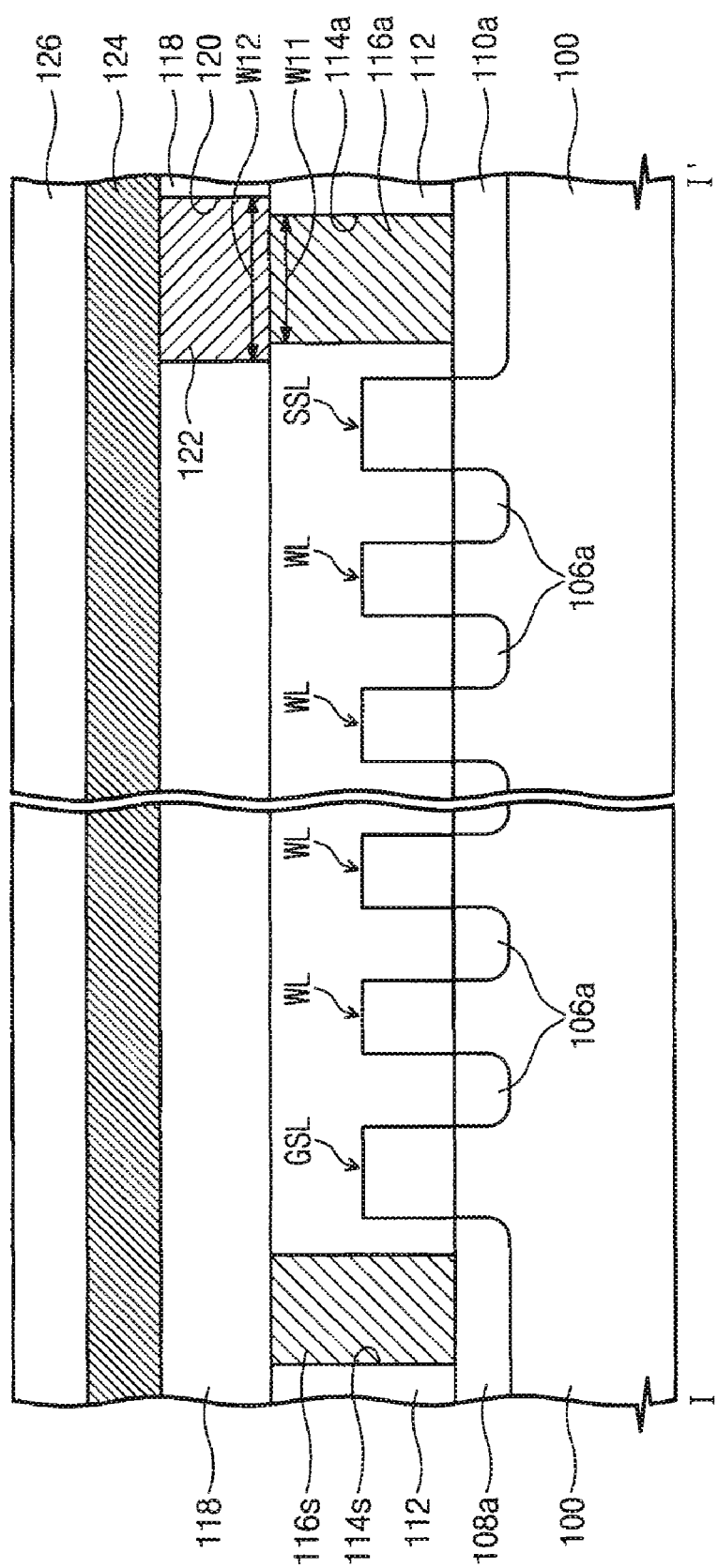
FIGS. 2A, 2B and 2C are cross-sectional views illustrating the semiconductor memory device shown in FIG. 1, taken along lines I-I', II-II' and III-III' of FIG. 1, respectively, according to some embodiments.
Figure 2B:
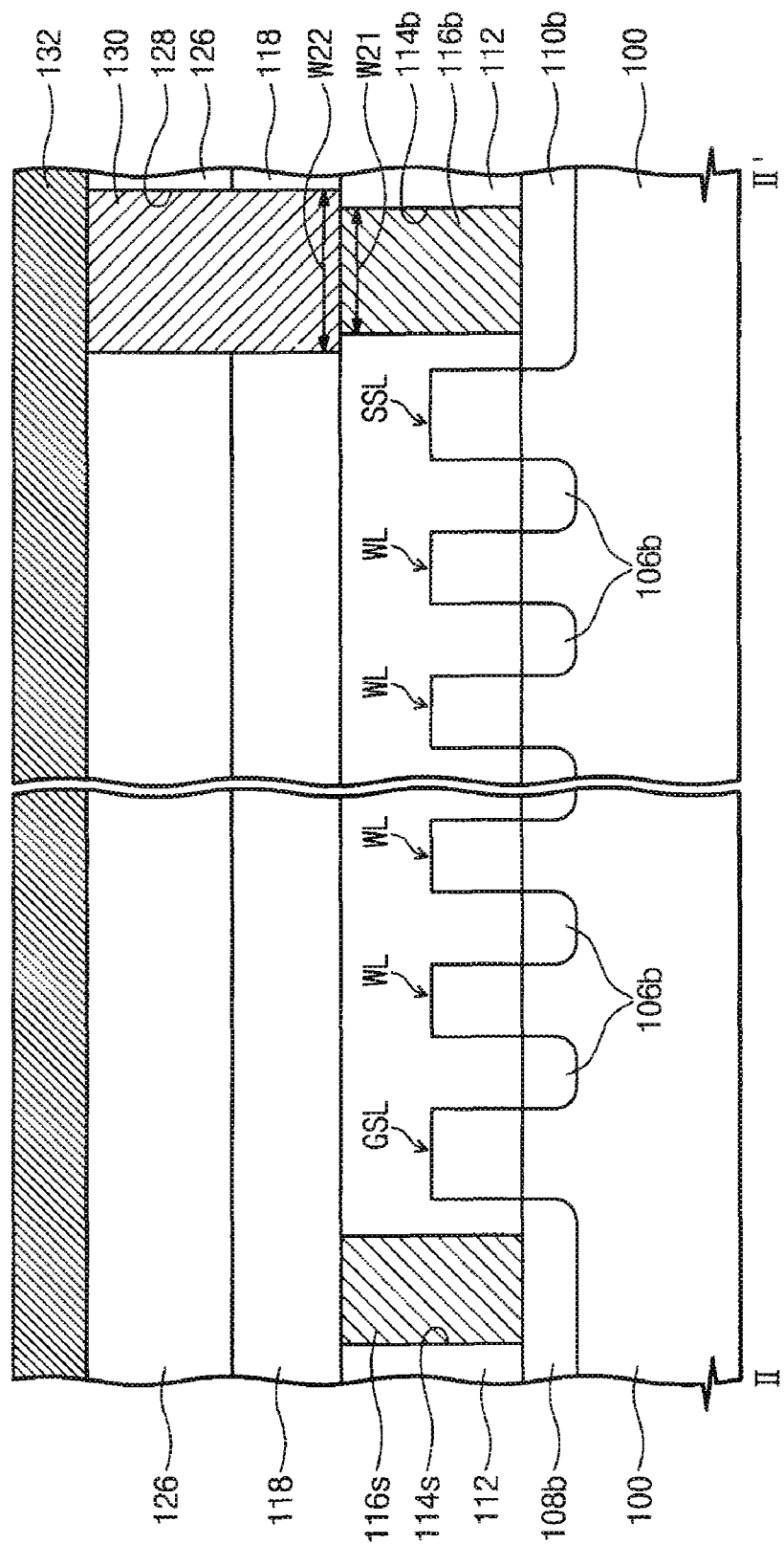
Figure 2C:
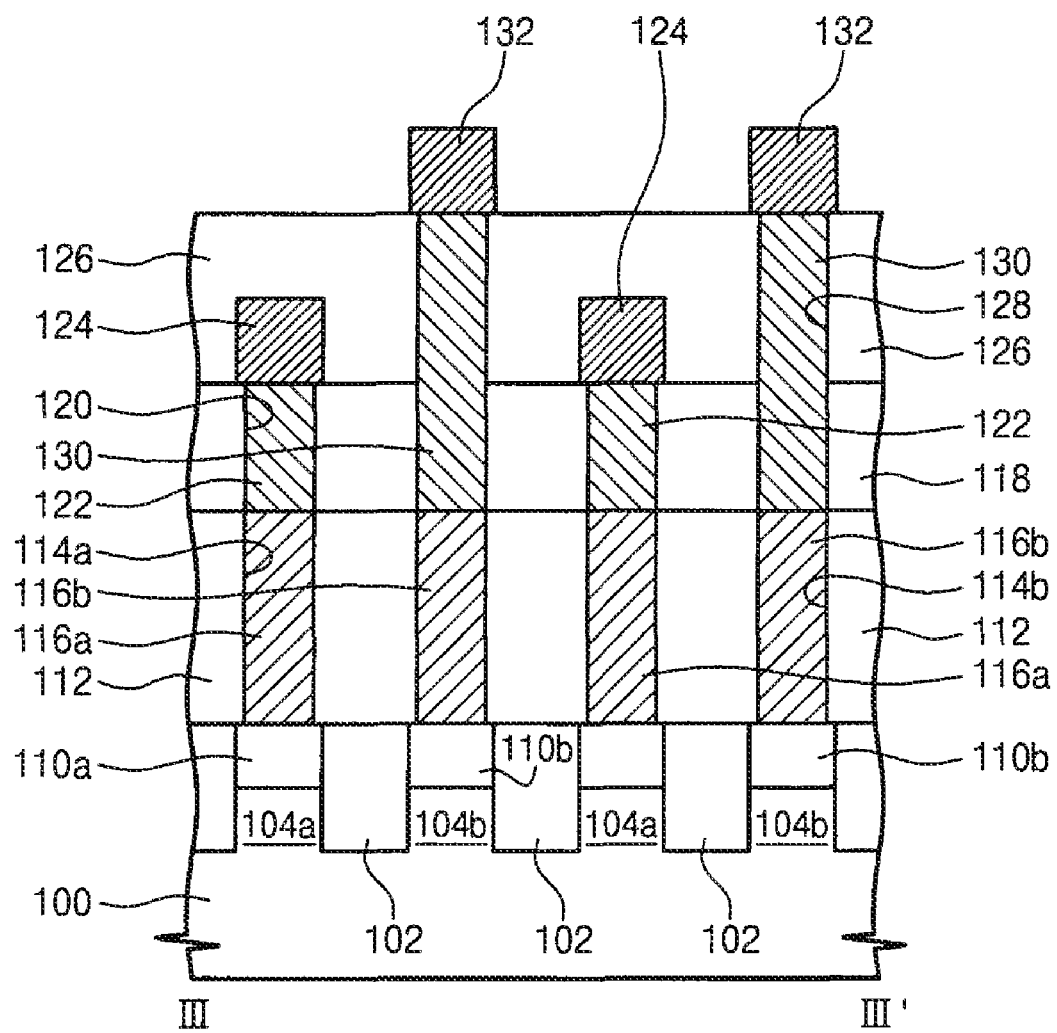

FIGS. 2A, 2B and 2C are cross-sectional views illustrating the semiconductor memory device shown in FIG. 1, taken along lines I-I', II-II' and III-III' of FIG. 1, respectively, according to some embodiments.

Referring generally to FIGS. 2A, 2B and 2C, the semiconductor memory device may further include an insulation layer 112 formed over the semiconductor substrate 100 and on each of the plurality of first active regions 104a and each of the plurality of second active regions 104b; a first interlayer dielectric 118 located on the insulation layer 112 and over each of the plurality of first active regions 104a and each of the plurality of second active regions 104b; and a second interlayer dielectric 126 located on the first interlayer dielectric 118 and also on the first cell bit lines 124. The first interlayer dielectric 118 is also located over the common source line 116s.

In one embodiment, the insulation layer 112 may have a substantially planar upper surface over the semiconductor substrate 100, the first interlayer dielectric 118 may have a substantially planar upper surface over the insulation layer 112 and the second interlayer dielectric 126 may have a substantially planar upper surface over the first interlayer dielectric 118.

As shown in FIG. 2A, each of the plurality of first active regions 104a may include a first common source region 108a, a first drain region 110a and a plurality of first cell source/drain regions 106a (also referred to herein as "a plurality of first source/drain regions"). The first common source region 108a and the first drain region 110a are spaced apart from each other. In the plurality of first active regions 104a, the plurality of first cell source/drain regions 106a may be formed on both sides of the plurality of the word lines WL.

Similarly, as shown in FIG. 2B, each of the plurality of second active regions 104b may include a second common source region 108b, a second drain region 110b and a plurality of second cell source/drain regions 106b (also referred to herein as "a plurality of second source/drain regions"). The second common source region 108b and the second drain region 110b are spaced apart from each other. In the plurality of second active regions 104b, the plurality of second cell source/drain regions 106b may be formed on both sides of the plurality of the word lines WL.

In one embodiment, the first and second cell source/drain regions 106a and 106b, the first and second common source regions 108a and 108b and the first and second drain regions 110a and 110b include dopants of the same conductivity type.

The first common source region 108a and the second common source region 108b are arranged alternately along the "y" direction. The first common source region 108a and the second common source region 108b may be arranged in a single row along the "y" direction. Also, the first drain region 110a and the second drain region 110b are arranged alternately along the "y" direction. The first drain region 110a and the second drain region 110b may be arranged in a single row along the "y" direction.

In one embodiment, the ground selection line GSL, the word lines WL, and the string select line SSL extend across the plurality of first active regions 104a and the plurality of second active regions 104b along the "y" direction. The ground selection line GSL, the word lines WL, and the string select line SSL are disposed between the first common source region 108a and the first drain region 110a and also between the second common source region 108b and the second drain region 110b. The ground selection line GSL is adjacent to the first common source region 108a and the second common source region 108b. Further, the string select line SSL is adjacent to the first drain region 110a and the second drain region 110b.

The ground selection line GSL and the string select line SSG each include a gate electrode and a gate dielectric disposed between the gate electrode and the first and second active regions 104a and 104b. The word line WL may include a tunnel gate dielectric, a charge storage element, e.g., a conductive-type charge storage element or charge-trap-type storage element, an intergate dielectric, and a control gate electrode. The word line WL may include a sidewall spacer on its sidewalls.

In one embodiment, the insulation layer 112 may cover the surface of the semiconductor substrate 100 having the ground select line GSL, word lines WL and string select line SSL formed thereon. The insulation layer 112 may be formed of a dielectric material such as an oxide layer, a nitride layer, or an oxynitride layer, or the like, that are known to form an interlayer dielectric. The insulation layer 112 may be a single layer or a multi-layer structure.

In one embodiment, the first interlayer dielectric 118 may be formed of a conventional interlayer dielectric material such as an oxide, a nitride or an oxynitride. The first interlayer dielectric 118 may be a single layer or a multi-layer structure. In another embodiment, the second interlayer dielectric 126 may be formed of a conventional interlayer dielectric material such as an oxide, a nitride or an oxynitride. The second interlayer dielectric 126 may be a single layer or a multi-layer structure.

As mentioned above with respect to FIG. 1, the common source line 116s may cross over each of the plurality of first active regions 104a and each of the plurality of second active regions 104b along the "y" direction. Accordingly, as shown in FIGS. 2A and 2B, the common source line 116s may contact the first common source region 108a and the second common source region 108b of each of the plurality of first active regions 104a and second active regions 104b, respectively. Therefore, the first common source region 108a and the second common source region 108b of each of the plurality of first active regions 104a and second active regions 104b may be electrically connected to one another by the common source line 116s.

In another embodiment, the common source line 116s may extend through the insulation layer 112. For example, the common source line 116s may be disposed within a source groove 114s defined in the insulation layer 112 so as to extend through the insulation layer 112. The source groove 114s may extend along the "y" direction.

In one embodiment, the common source line 116s may include a material such as doped semiconductor such as doped polysilicon, Ti, TiN, Ta, TaN, W, WN, Cu, Al, or the like, or compounds thereof, metal silicide such as cobalt silicide or titanium silicide or any other combination thereof. In another embodiment, the common source line 116s may include substantially the same material as the plurality of first cell landing plugs 116a and the plurality of second cell landing plugs 116b.

As mentioned above with respect to FIG. 1, the ground select line GSL may cross over each of the plurality of first active regions 104a and each of the plurality of second active regions 104b. Accordingly, as shown in FIGS. 2A and 2B, a portion of the ground select line GSL crossing over a first active region 104a may be disposed between the first common source region 108a and an adjacent first cell source/drain region 106a and a portion of the ground select line GSL crossing over a second active region 104b may be disposed between the second source region 108b and an adjacent second cell source/drain region 106b.

As mentioned above with respect to FIG. 1, each of the word lines WL may cross over each of the plurality of first active regions 104a and each of the plurality of second active regions 104b. Accordingly, as shown in FIGS. 2A and 2B, portions of each word line WL crossing over a first active region 104a may be disposed between a pair of adjacent first cell source/drain regions 106a and portions of each word line WL crossing over a second active region 104b may be disposed between a pair of adjacent second cell source/drain regions 106b. In one embodiment, each word line WL may be included as a part of a memory cell disposed over an active region between a pair of adjacent source/drain regions. Accordingly, a plurality of memory cells may be arranged over an active region along the "x" direction. Each word line WL, therefore, may electrically connect memory cells along the "y" direction. Although not illustrated, sidewall spacers may be present along sidewalls of the memory cells, word lines WL, ground select line GSL and string select line SSL.

As mentioned above with respect to FIG. 1, the string select line SSL may cross over each of the plurality of first active regions 104a and each of the plurality of second active regions 104b. Accordingly, as shown in FIGS. 2A and 2B, a portion of the string select line SSL crossing over a first active region 104a may be disposed between the first drain region 110a and an adjacent first cell source/drain region 106a and a portion of the string select line SSL crossing over a second active region 104b may be disposed between the second drain region 110b and an adjacent second cell source/drain region 106b.

As exemplarily shown in FIGS. 2A and 2C, each of the plurality of first cell landing plugs 116a may contact a first drain region 110a via the insulation layer 112 and each of the plurality of first cell contact plugs 122 may contact one of the plurality of first cell landing plugs 116a and a corresponding one of the plurality of first cell bit lines 124 through the first interlayer dielectric 118. As a result, the first drain region 110a can be electrically coupled to the corresponding one of the plurality of first bit lines 122 via the first cell landing plug 116a and the first cell contact plug 122.

The plurality of first cell landing plugs 116a may be disposed within a corresponding first landing hole 114a defined in the insulation layer 112 so as to extend through the insulation layer 112.

In some embodiments, the first cell landing plugs 116a and the second cell landing plugs 116b are arranged alternately along the "y" direction. The first cell landing plugs 116a and the second cell landing plugs 116b may be arranged in a single row along the "y" direction i.e., a direction perpendicular to the bit line, e.g., 124.

In some embodiments, although the upper surface of first cell landing plugs 116a or the upper surface of second cell landing plugs 116b are shown to be substantially rectangular in plan view, it may be substantially any shape, e.g., an oval shape, having a long axis that is parallel to the "x" direction.

In another embodiment, each of the plurality of first cell contact plugs 122 may extend through the first interlayer dielectric 118. For example, each of the plurality of first cell contact plugs 122 may be disposed within a corresponding first contact hole 120 defined in the first interlayer dielectric 118 so as to extend through the first interlayer dielectric 118.

In some embodiments, a sidewall spacer comprising an insulating material may be formed within the first contact hole 120 to be located between the first cell contact plug 122 and sidewalls of the first contact hole 120. Consequently, the electrical isolation between the second bit lines 132 and the first cell contact plugs 122 can be improved.

In view of the above, the first drain region 110a can be electrically connected to a corresponding one of the plurality of first cell bit lines 124 via a "first conductive structure" including a first cell landing plug 116a and a first cell contact plug 122 electrically connected thereto, wherein the first conductive structure extends through the insulation layer 112 and the first interlayer dielectric 118.

As shown in FIGS. 1 and 2A, a width of an upper portion of the first landing hole 114a (i.e., a distance between opposing sidewalls of the first landing hole 114a, measured along the "x" direction) is less than a width of a lower portion of the first contact hole 120 (i.e., a distance between opposing sidewalls of the lower portion of the first contact hole 120, measured along the "x" direction). Accordingly, a width W11 of an upper portion of the first landing plug 116a may be less than a width W12 of a lower portion of the first cell contact plug 122.

According to one aspect of the present invention, the upper surface of the first cell contact plug 122 is substantially rectangular in plan view and its long axis is parallel to the "x" direction. In other words, the width of the first cell contact plug 122 along the "x" direction is greater than the width of the first cell contact plug 122 along the "y" direction. As a result, even when the first cell contact plug 122 and the first cell landing plug 116a are misaligned, the contact area between the first cell contact plug 122 and the first landing plug 116 can be consistently the width of the upper portion of the first cell landing plug 116a. As a result, repeatability may be obtained. The width of the first cell contact plug 122 along the "y" direction can be the same or similar to the width of the first cell landing plug 116a. In another embodiment, the upper surface of the first cell contact plug 122 may be substantially any shape, e.g., an oval shape, having a long axis that is parallel to the "x" direction.

As exemplarily shown in FIGS. 2B and 2C, each of the plurality of second cell landing plugs 116b may contact a second drain region 110b of a corresponding one of the plurality of second active regions 104b and each of the plurality of second cell contact plugs 130 may contact a second cell landing plug 116b and a corresponding one of the plurality of second cell bit lines 132. As a result, the second drain region 110b can be electrically coupled to the corresponding one of the plurality of second cell bit lines 132 via the second cell landing plug 116b and the second cell contact plug 130.

In one embodiment, upper surfaces of the plurality of second cell landing plugs 116b may be substantially coplanar with the upper surface of the insulation layer 112. In another embodiment, each of the plurality of second cell landing plugs 116b may be disposed within a corresponding second landing hole 114b defined in the insulation layer 112 so as to extend through the insulation layer 112.

In one embodiment, each of the plurality of second cell contact plugs 130 may extend through the first interlayer dielectric 118 and the second interlayer dielectric 126 to be coupled to the second cell landing plug 116b. For example, each of the plurality of second cell contact plugs 130 may be disposed within a corresponding second contact hole 128 defined in the first interlayer dielectric 118 and the second interlayer dielectric 126 so as to extend through the first interlayer dielectric 118 and the second interlayer dielectric 126. The second contact hole 128 accordingly exposes at least a portion of the second cell landing plug 116b.

In one embodiment, a sidewall spacer may be formed within the second contact hole 128 between a second cell contact plug 130 and a corresponding one of the first bit lines 124 to improve the electrical isolation therebetween.

In view of the above, a second drain region 110b of each of the plurality of second active regions 104b can be electrically connected to a corresponding one of the plurality of second cell bit lines 132 via a "second conductive structure" including a second cell landing plug 116b and a second cell contact plug 130 electrically connected thereto, wherein the second conductive structure extends through the insulation layer 112, the first interlayer dielectric 118 and the second interlayer dielectric 126.

In one embodiment, an upper surface of at least one of the first cell landing plug 116a and the second cell landing plug 116b is substantially coplanar with an upper surface of the common source line 116s.

In one embodiment, the first and second landing plugs 116a and 116b may have substantially same height as the common source line 116s.

In one embodiment, an upper surface of the plurality of first cell landing plugs 116a, an upper surface of the plurality of second cell landing plugs 116b, and/or the upper surface of the common source line 116s may be substantially coplanar with the upper surface of the insulation layer 112. For example, a top surface of the insulation layer 112 is substantially coplanar with a top surface of at least one of the first landing plug 116a and the second landing plug 116b.

As a result, the height of the first cell contact plug 122 (or the depth of the first contact hole 120) to couple the first cell bit lines 124 and the first drain 110a can be reduced due to the presence of the first cell landing plug 116a. Also, the height of the second cell contact plug 130 (i.e., the depth of the second contact hole 128) to couple the second bit lines 130 and the second drain 110b can be reduced due to the presence of the second cell landing plug 116b. As a result, the aspect ratio of the first and second contact holes 120 and 128 are substantially reduced, thereby substantially reducing a "not open" phenomenon or the generation of voids therein. In other words, the increase in the aspect ratio of the first and second contact holes 120 and 128 resulting from the common source line 116s can be reduced with the first and second landing plugs 116a and 116b. Further, the aspect ratio of the second contact hole 128, which extends deeper than the first contact hole 120, can be substantially reduced.

Furthermore, the second cell contact plug 130 sequentially penetrates the second interlayer dielectric 126 and the first interlayer dielectric, 118 without being stopped by a conductive pad formed of the same material that forms the first cell bit lines 124. As a result, the patterning of the first cell bit lines 124 can be simpler and more efficient with embodiments of the present invention than the prior art process as no conductive pads are located between the contact plug, e.g., 130 and the landing plug, e.g., 116b.

Consequently, increased process margins can be obtained. If conductive pads are formed between the first cell bit lines, e.g., 124 and between the contact plug (e.g., 130) and the landing plug (116b) as in the prior art, it would be more difficult to perform a patterning process because the distance between the patterns are much narrower than some embodiments of the present invention.

As shown in FIGS. 1 and 2B, a width of an upper portion of the second landing hole 114b (i.e., a distance between opposing sidewalls of the upper portion of the second landing hole 114b, measured along the "x" direction) is less than a width of a lower portion of the second contact hole 128 (i.e., a distance between opposing sidewalls of the lower portion of the second contact hole 128, measured along the "x" direction). Accordingly, a width W22 of a lower portion of the second cell contact plug 130 is greater than a width 21 of an upper portion of the second landing plug 116b. The second cell contact plug 130 may have the similar structure to the first cell contact plug 122. For example, the upper surface of the second cell contact plug 130 may be substantially rectangular in plan view.

As a result, even when the second cell contact plug 130 and the second cell landing plug 116b are misaligned, the contact area between the second cell contact plug 130 and the second cell landing plug 116b can be consistent corresponding to the width of the upper portion of the second cell landing plug 116b. As a result, repeatability can be obtained. The width of the second cell contact plug 130 along the "y" direction can be the same or similar to the width of the second cell landing plug 116b. In another embodiment, the upper surface of the second cell contact plug 130 may be substantially any shape, e.g., an oval shape, having a long axis that is parallel to the "x" direction.

In one embodiment, a width of the lower portion of the second contact hole 128 at a bottom surface of the second interlayer dielectric 126 is substantially equal to a width of the second contact hole 128 at a top surface of the second interlayer dielectric 126. In one embodiment, a width of the lower portion of the second contact hole 128 at a bottom surface of the first interlayer dielectric 118 is substantially equal to a width of the second contact hole 128 at a top surface of the second interlayer dielectric 126. Accordingly, a width of an upper portion of the second cell contact plug 130 may be substantially equal to the width W22 of the lower portion of the second cell contact plug 130.

As shown in FIGS. 2A, 2B and 2C, the plurality of first cell bit lines 124 are formed on the first interlayer dielectric 118, the second interlayer dielectric 126 is formed over the first interlayer dielectric 118 and the plurality of first cell bit lines 124, and the plurality of second cell bit lines 132 are formed on the second interlayer dielectric 126. Accordingly, the plurality of first cell bit lines 124 are located at a different height above the semiconductor substrate 100 than the plurality of second cell bit lines 132. The plurality of first cell bit lines 124 and the plurality of second cell bit lines 132 are alternately disposed in the "y" direction.

Although not explicitly shown, sidewall spacers may, in one embodiment, be formed along sidewalls of the plurality of first cell bit lines 124 and the plurality of second cell bit lines 132. In such an embodiment, the sidewall spacers function as diffusion barrier layers, substantially preventing contaminants from deteriorating the electrical and mechanical properties of the bit lines. Also, with the sidewall spacers, the electrical isolation between the second cell contact plug 130 and the first cell bit lines 124 can be improved.

Referring to FIGS. 1 and 2C, in one embodiment, a distance between opposite sidewalls of an upper portion of a first cell contact plug 122, measured along the "y" direction, may be less than or substantially equal to a distance between opposite sidewalls of a lower portion of a corresponding one of the plurality of first cell bit lines 124, measured along the "y" direction. Similarly, a distance between opposite sidewalls of an upper portion of a second cell contact plug 130, measured along the "y" direction, may be less than or substantially equal to a distance between opposite sidewalls of a lower portion of a corresponding one of the plurality of second cell bit lines 132, measured along the "y" direction.

Constructed as exemplarily described above with respect to FIGS. 1, 2A, 2B and 2C, lateral distances between the plurality of first cell bit lines 124 and adjacent ones of the plurality of second cell contact plugs 130 may be increased, even when the device geometries of the semiconductor memory device decrease. Also, lateral distances between the adjacent two first cell bit lines 124 or between the adjacent two second cell bit lines 132 can be increased. As a result, undesirable effects of coupling capacitances between bit lines, conventionally observed during programming of the memory cells included in the semiconductor memory device, may substantially reduced. Further, process margin to form the first and second bit lines 124 and 132 can be increased.

Figure 3:
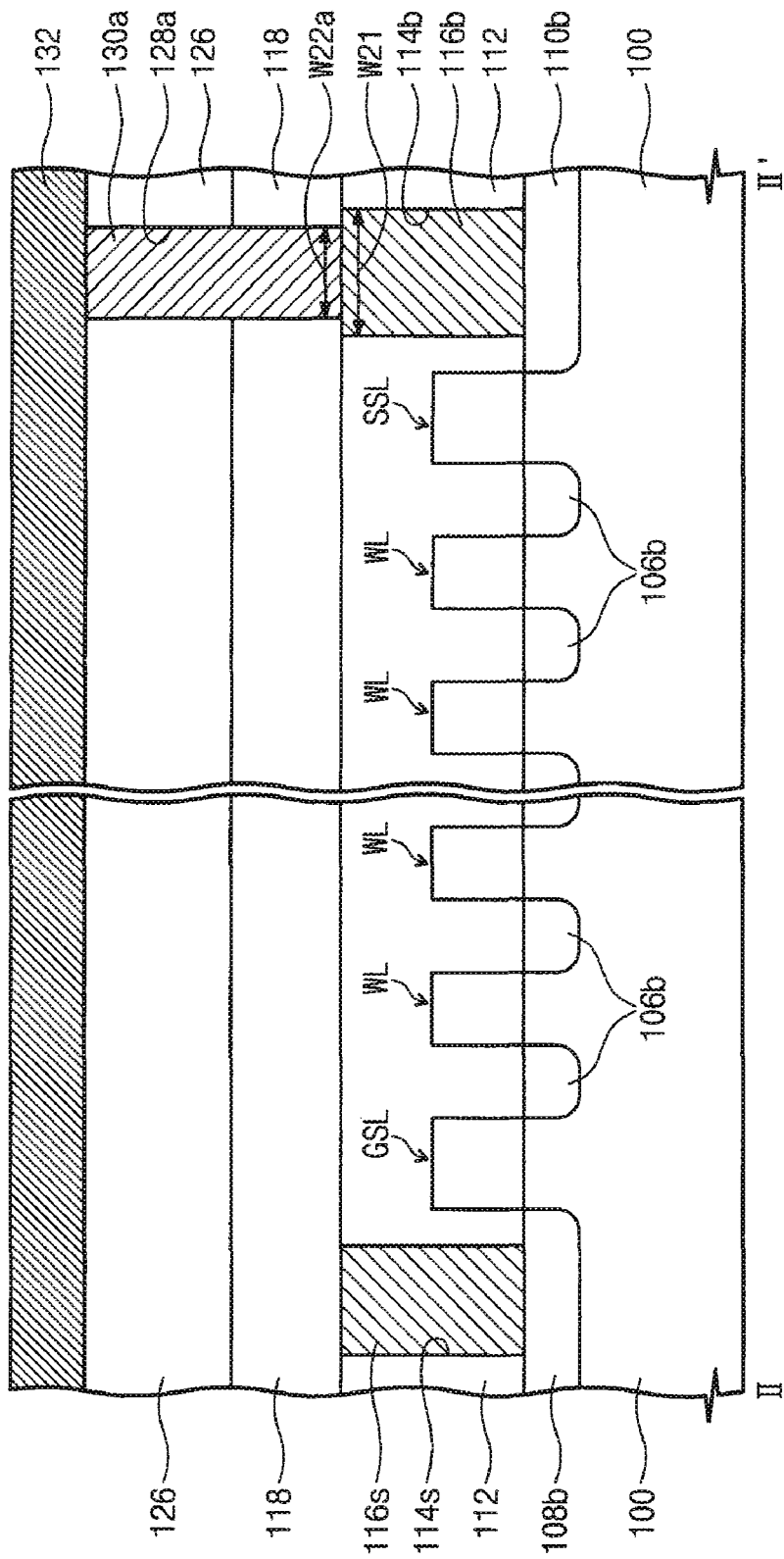
FIG. 3 is a cross-sectional view illustrating the semiconductor memory device shown in FIG. 1, taken along line II-II' of FIG. 1, according to another embodiment.

FIG. 3 is a cross-sectional view illustrating the semiconductor memory device shown in FIG. 1, taken along line II-II' of FIG. 1, according to another embodiment. For the sake of brevity, only the differences between the embodiment described above with respect to FIGS. 1 and 2B and the embodiment shown in FIG. 3 will be discussed.

In contrast with In FIGS. 1 and 2B, as discussed above, according to the embodiment exemplarily illustrated in FIG. 3, the width of the upper portion of the second landing hole 114b is greater than the width of the lower portion of the second contact hole 128a. That is, the width W21 of the upper portion of the second landing plug 114b may be greater than the width W22a of the lower portion of the second cell contact plug 130a. As a result, even when there is a misalignment between the second cell landing plug 116b and the second cell contact plug 130a, the contact area between the second cell landing plug 116b and the second cell contact plug 130a can be consistently the width of the lower portion of the second cell contact plug 130a, improving the device reliability.

Figure 4:
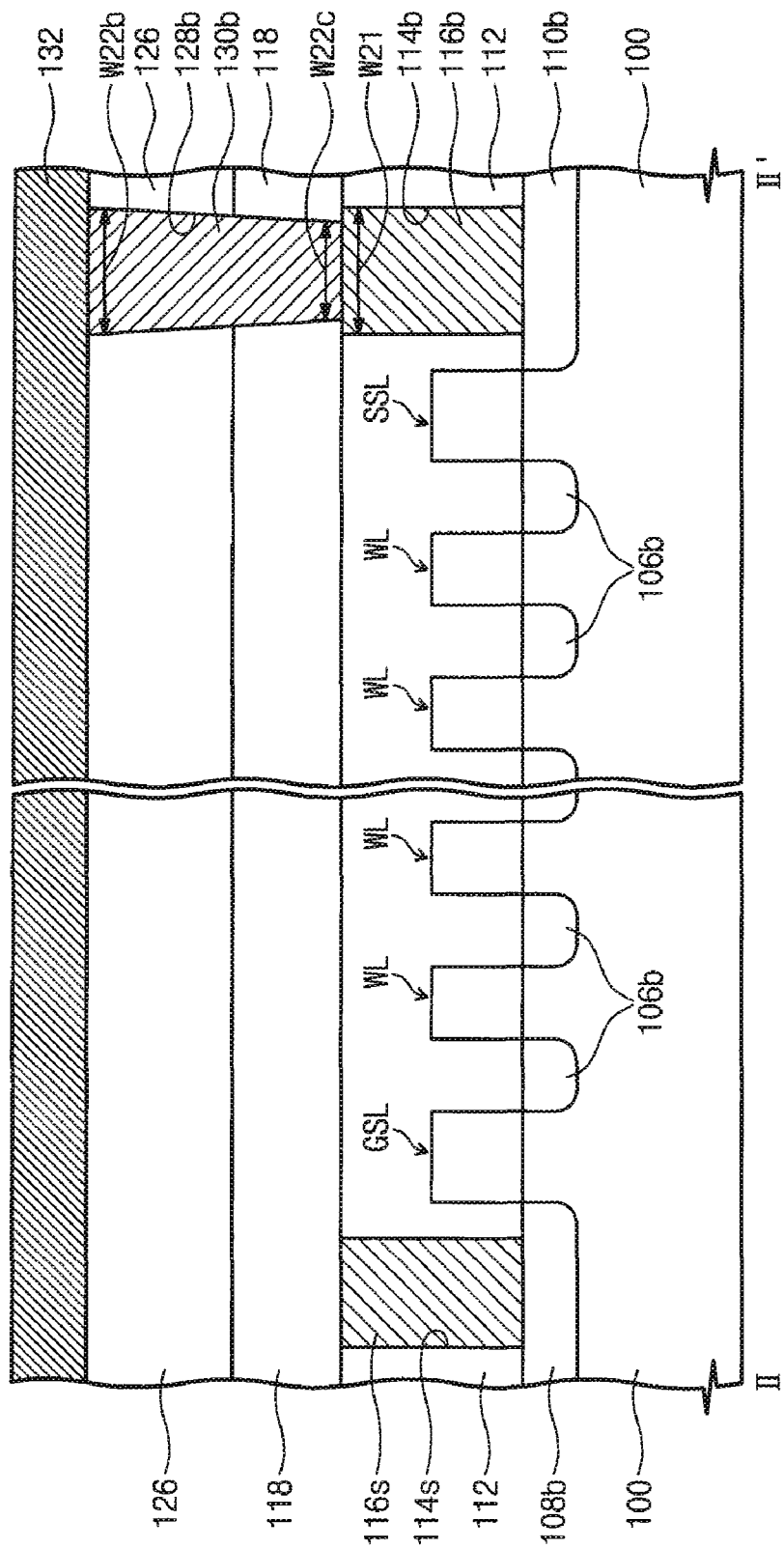
FIG. 4 is a cross-sectional view illustrating the semiconductor memory device shown in FIG. 1, taken along line II-II' of FIG. 1, according to yet another embodiment.

FIG. 4 is a cross-sectional view illustrating the semiconductor memory device shown in FIG. 1, taken along line II-II' of FIG. 1, according to yet another embodiment. For the sake of brevity, only the differences between the embodiments described above with respect to FIG. 2B and the embodiment shown in FIG. 4 will be discussed.

According to the embodiment exemplarily illustrated in FIG. 4, the width of the lower portion of the second contact hole 128b at the bottom surface of the first interlayer dielectric 118 may be less than the width of the second contact hole 128b at the top surface of the second interlayer dielectric 126. Consequently, the width W22c of the lower portion of the second cell contact plug 130b may be less than the width W22b of the upper portion of the second cell contact plug 130b. As a result, the second cell contact plug 130 may be tapered from the top to the bottom thereof. In other words, sidewalls of the second cell contact plug 130 may be sloped.

In some embodiments, the width W22b of the upper portion of the second cell contact plug 130b may be approximately the same as the width W21 of the second cell landing plug 116b.

Further, the first cell contact plug 122 of FIG. 2A may be formed similar to the second cell contact plug 130b of FIG. 4. For example, the width of the upper portion of the first cell contact plug 122 may be greater than the width of the lower portion of the first cell contact plug 122. In addition, the width of the lower portion of the first cell contact plug 122 may be less than the width of the upper portion of the first cell landing plug 116a, e.g., tapered from the top to bottom thereof.

Figure 5:
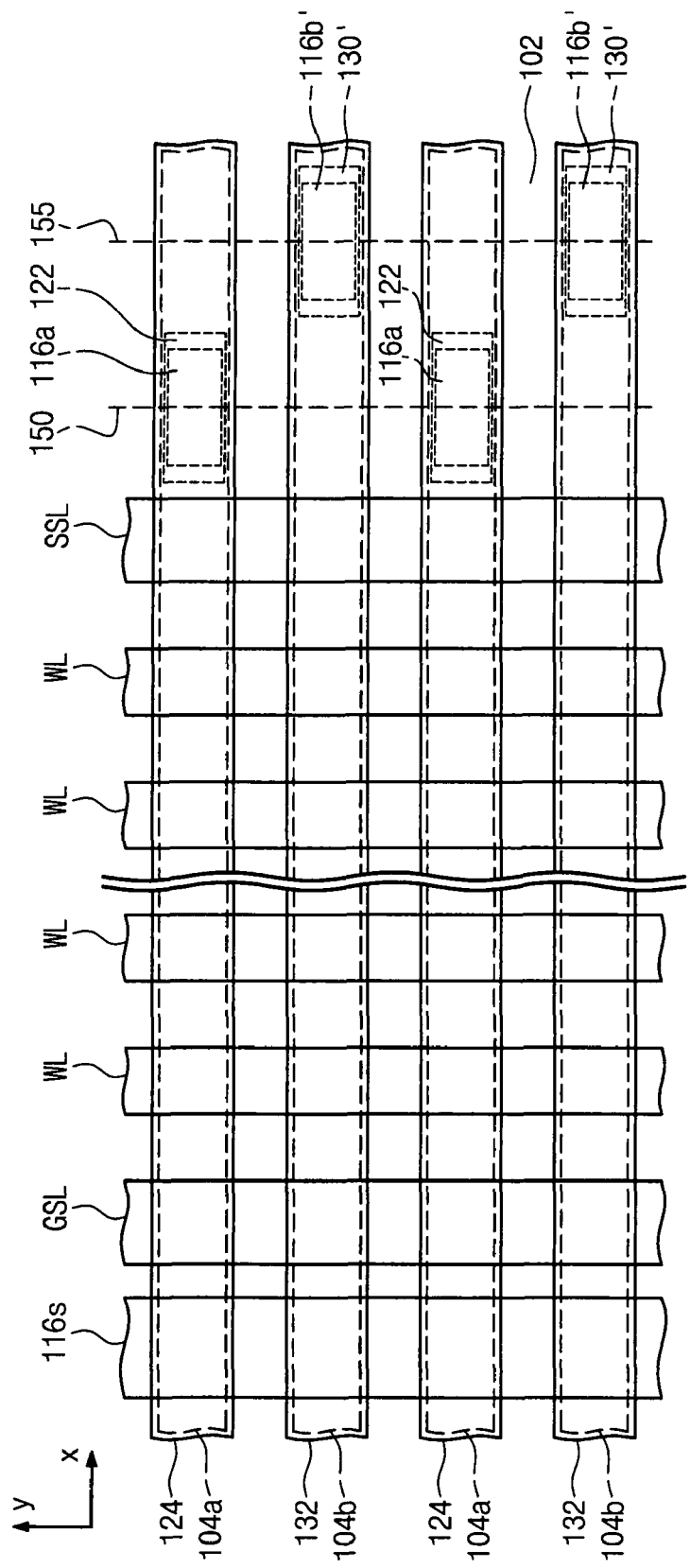
FIG. 5 is a plan view of a semiconductor memory device according to another embodiment.

FIG. 5 is a plan view of a semiconductor memory device according to another embodiment. Referring to FIG. 5, a semiconductor memory device according to another embodiment may be provided as similarly described above with respect to FIG. 1. For the sake of brevity, only the differences between the embodiments described above with respect to FIG. 1 and the embodiment shown in FIG. 5 will be discussed.

As described above with respect to FIG. 1, the plurality of first conductive structures may be substantially aligned with the plurality of second conductive structures along the "y" direction. According to the embodiment exemplarily illustrated in FIG. 5, however, the plurality of first conductive structures may be offset from the plurality of second conductive structures along the "y" direction, i.e., the direction that the bit line 124 extends. Accordingly, a first virtual line 150 extending along the "y" direction may conceptually bifurcate the each of the first conductive structures (including the first cell landing plugs 116a and first cell contact plugs 122) at approximately middle portions thereof and a second virtual line 155 extending along the "y" direction may conceptually bifurcate each of the second conductive structures (including the second cell landing plugs 116b' and second cell contact plugs 130') at substantially middle portions thereof. In one embodiment, each of the plurality of first conductive structures may be offset from each of the plurality of second conductive structures such that the first virtual line 150 may not intersect any of the plurality of second conductive structures and such that the second virtual line 155 does not intersect any of the plurality of first conductive structures. The first virtual line 150 and the second virtual line 155 may be spaced apart from each other. The first conductive structures and the second conductive structures may be described as being arranged in a zigzag manner. As a result, the distance between the adjacent first and second conductive structures can be sufficiently maintained, increasing the photolithography process margins for forming the first and second conductive structures.

Figure 6A:
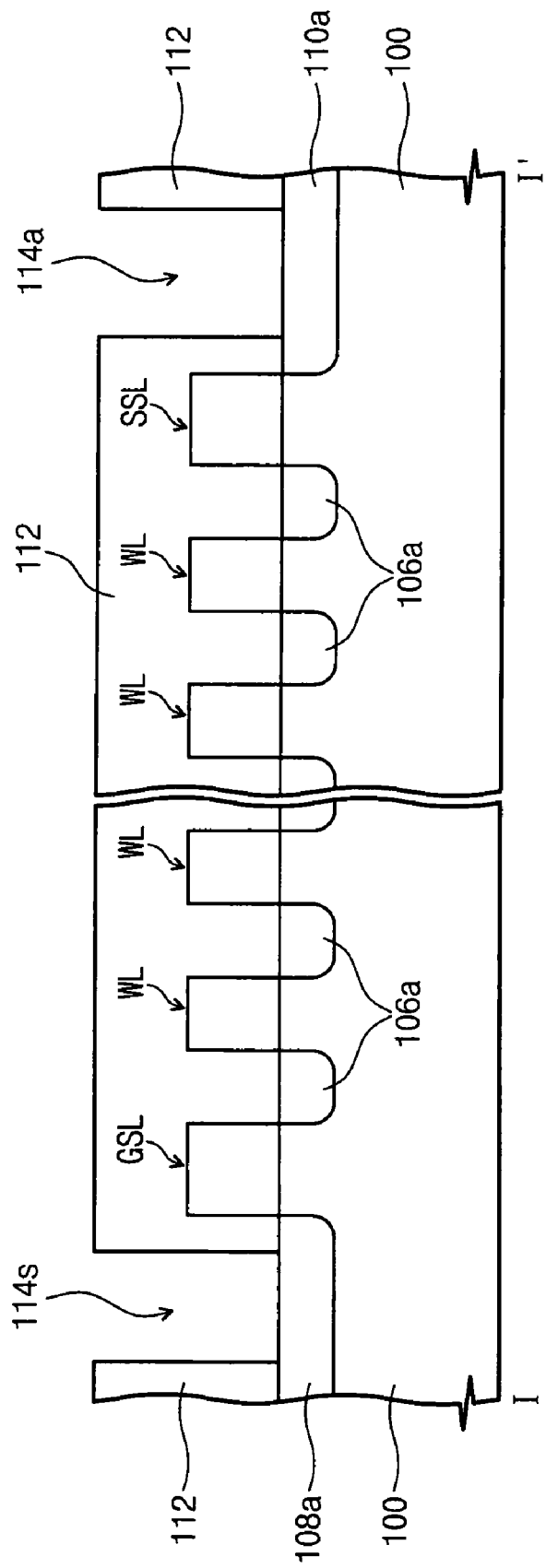
FIGS. 6A, 6B and 6C are cross-sectional views illustrating a method of forming the semiconductor memory device shown in FIG. 1, taken along line I-I' of FIG. 1, according to one embodiment.
Figure 6B:
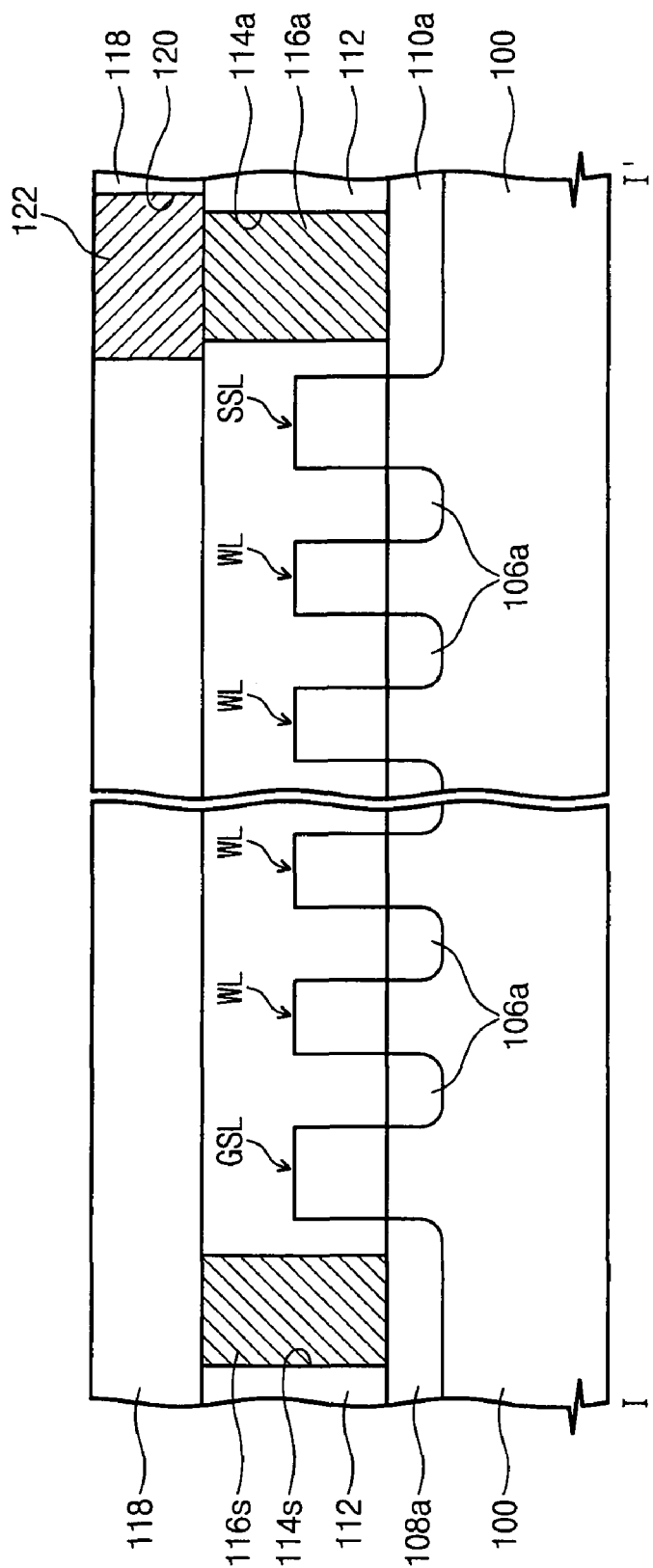
Figure 6C:
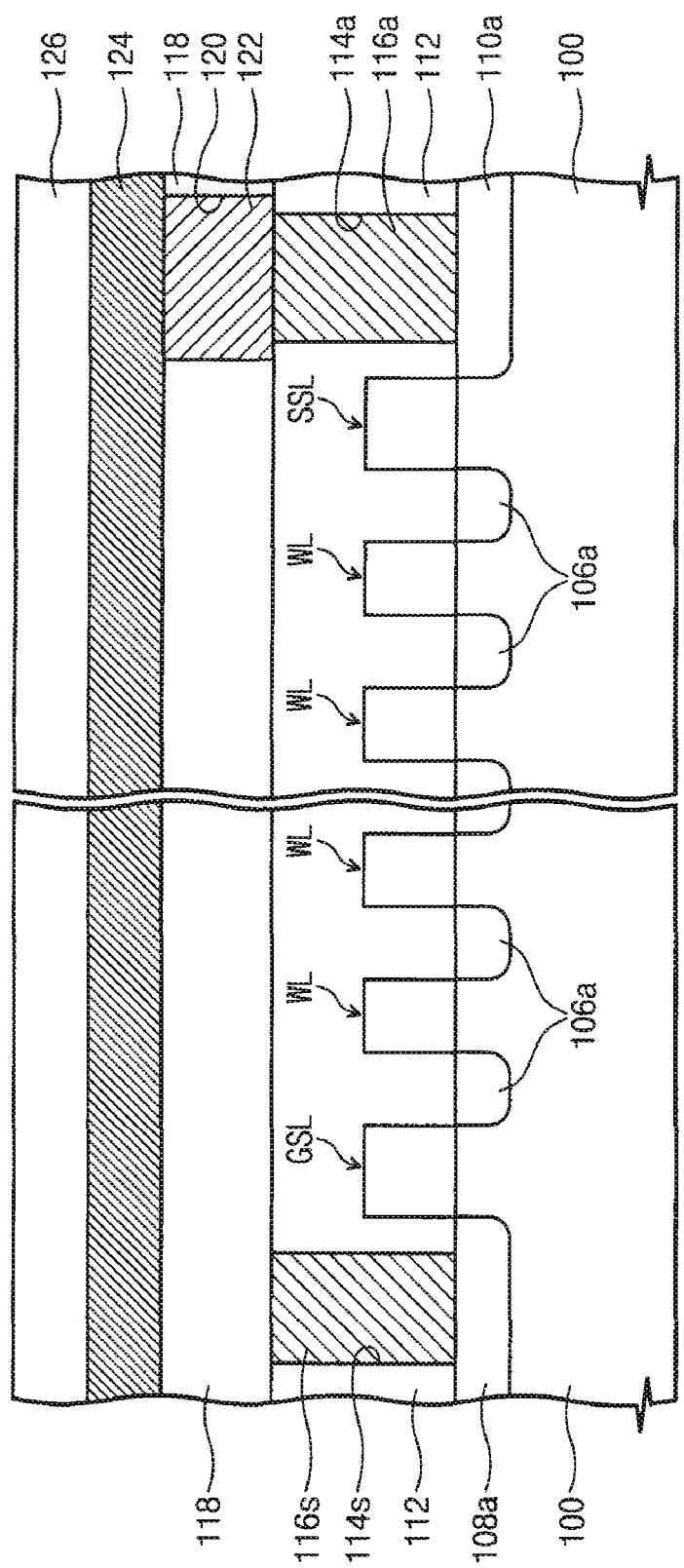
Figure 7B:
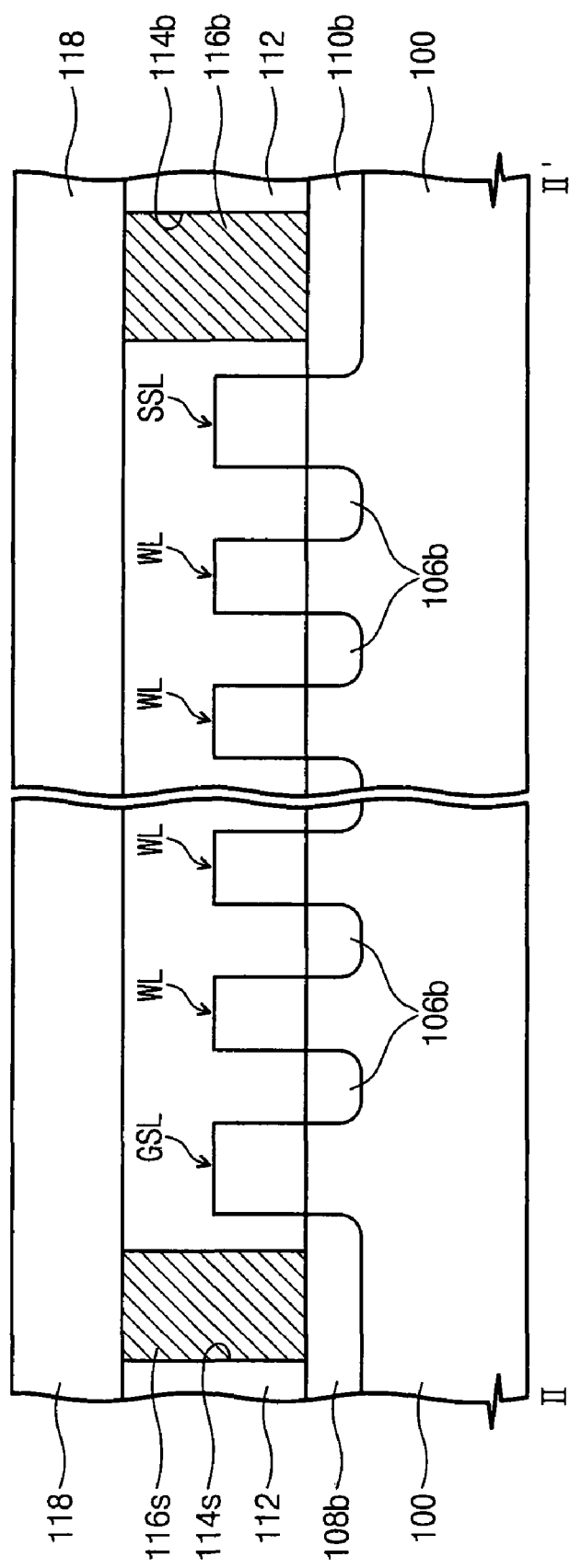
Figure 7C:
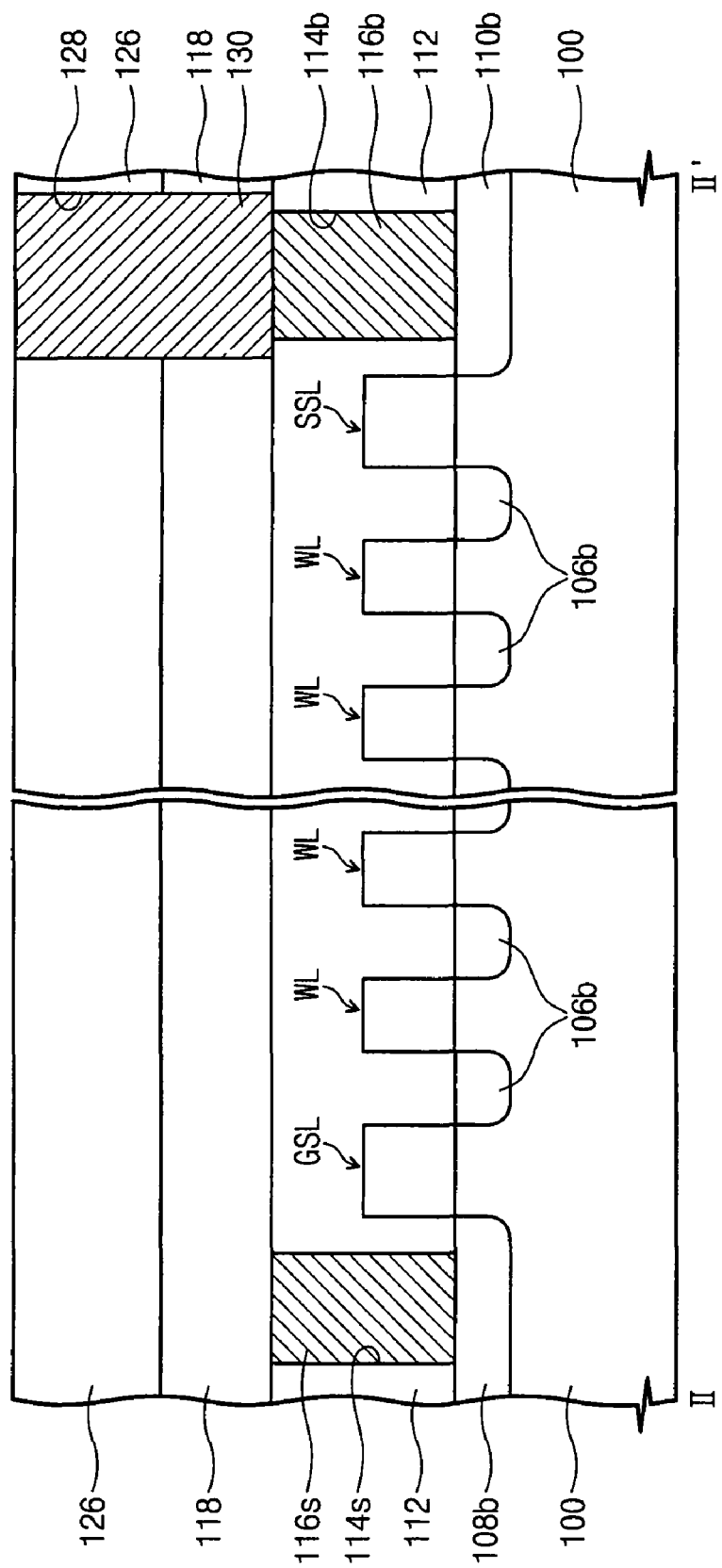
Figure 8A:
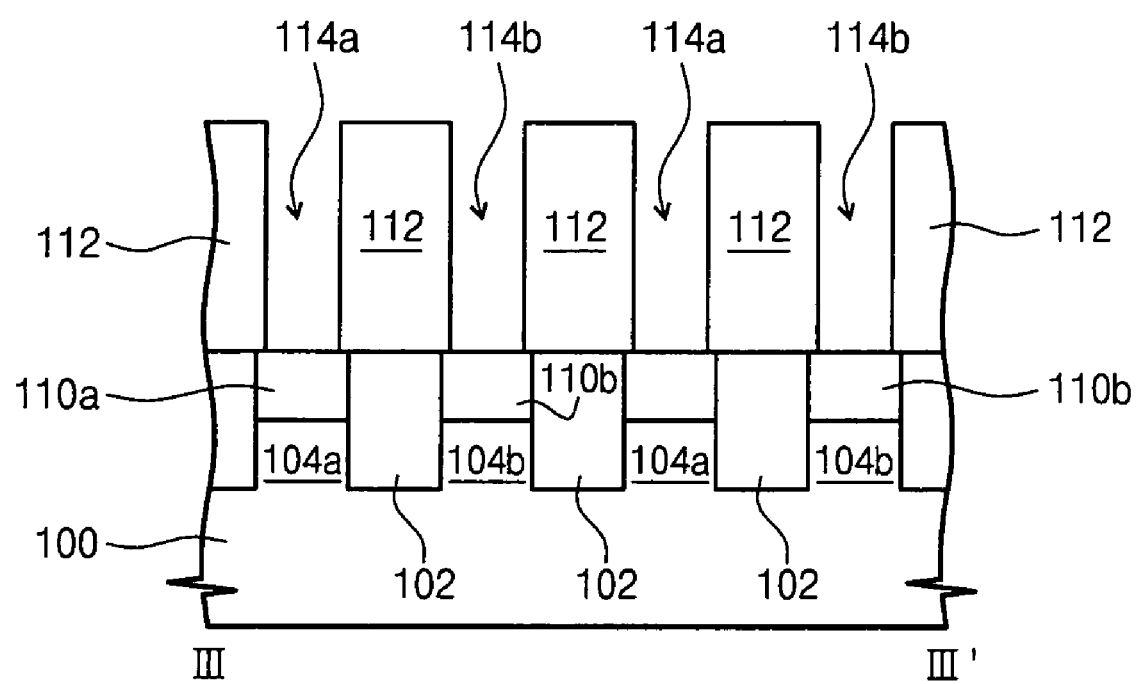
FIGS. 8A, 8B and 8C are cross-sectional views illustrating a method of forming the semiconductor memory device shown in FIG. 1, taken along line III-III' of FIG. 1, according to one embodiment.
Figure 8B:
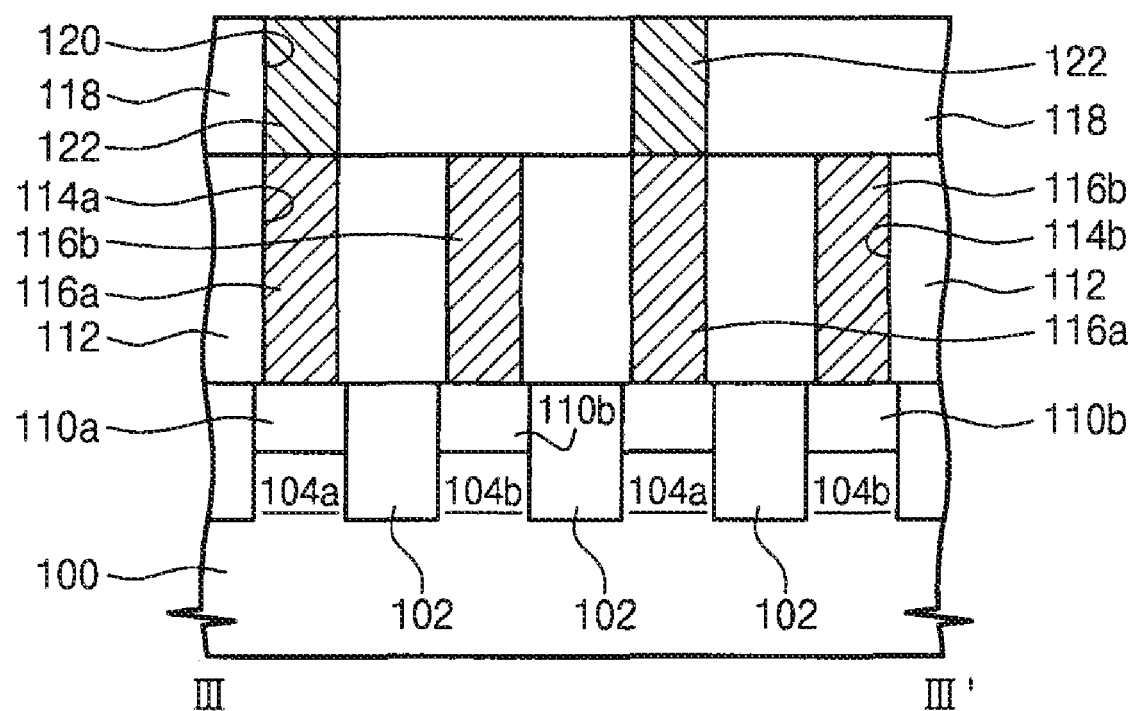
Figure 8C:
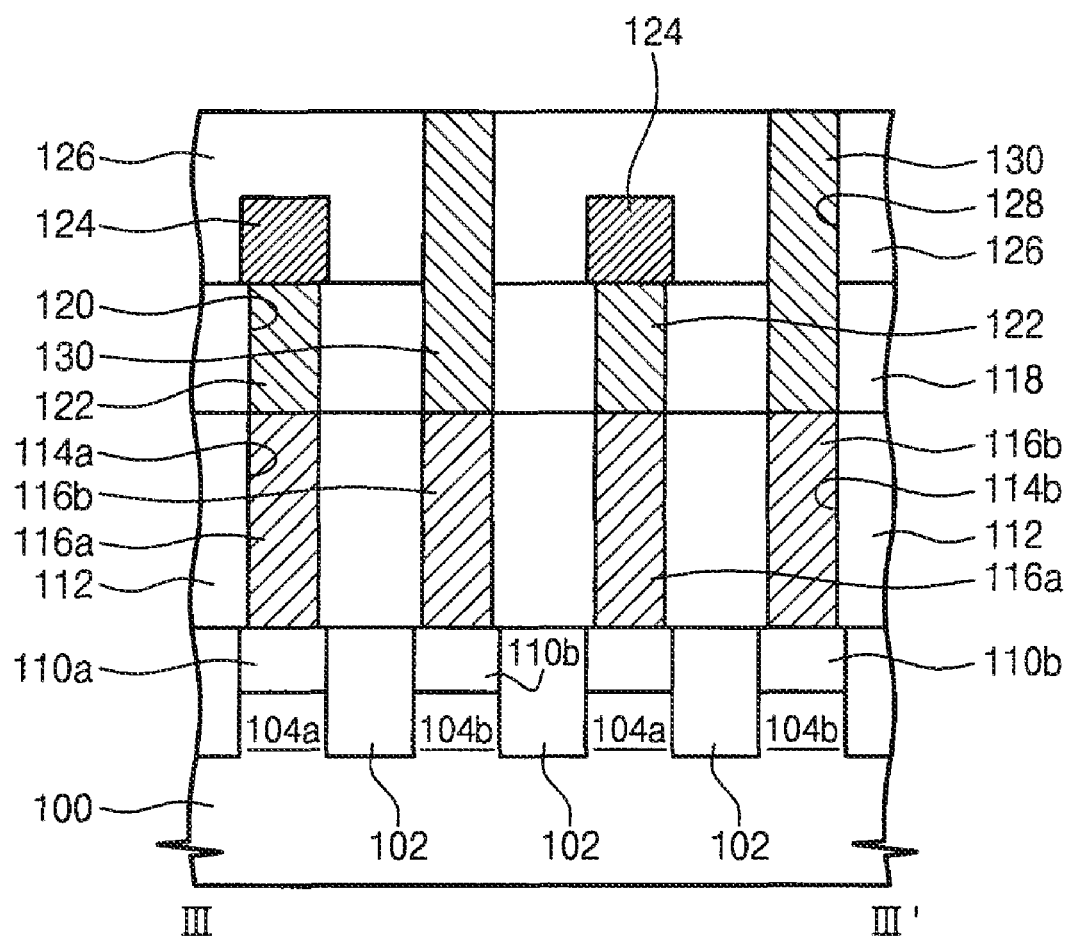

FIGS. 6A, 6B and 6C are cross-sectional views illustrating a method of forming the semiconductor memory device shown in FIG. 1, taken along line I-I' of FIG. 1, according to one embodiment. FIGS. 7A, 7B and 7C are cross-sectional views illustrating a method of forming the semiconductor memory device shown in FIG. 1, taken along line II-II' of FIG. 1, according to one embodiment. FIGS. 8A, 8B and 8C are cross-sectional views illustrating a method of forming the semiconductor memory device shown in FIG. 1, taken along line III-III' of FIG. 1, according to one embodiment.

Initially, the device isolation pattern 102 is formed to define the plurality of first active regions 104a and the plurality of second active regions 104b. Then, the ground select line GSL, the plurality of word lines WL, the string select lines SSL, the plurality of first common source regions 108a, the plurality of second common source regions 108b, the plurality of first drain regions 110a and the plurality of second drain regions 110b may be formed on the semiconductor substrate 100 by any suitable process. In detail, using the ground select line GSL, the word lines WL, the string select lines SSL as a mask, impurities are doped into the plurality of first active regions 104a and the plurality of second active regions 104b. As a result, the first common source region 108a and the second common source region 108b are formed adjacent a side of the ground select line GSL within the first active regions 104a and the second active regions, respectively. Further, the first drain region 110a and the second drain region 110b are formed adjacent a side of the string select line SSL within the first active region 104a and the second active region 104b respectively. Also, the first cell source/drain regions 106a and the second cell source/drain regions are formed on both sides of the word lines WL within the first active regions 104a and the second active regions 104b respectively.

Subsequently, and referring to FIGS. 6A, 7A and 8A, an insulation layer 112 may be formed over the semiconductor substrate 100. In one embodiment, the insulation layer 112 may be formed over each of the plurality of first active regions 104a and each of the plurality of second active regions 104b. Accordingly, the insulation layer 112 may cover the ground select line GSL, the plurality of word lines WL and the string select line SSL. As shown in FIGS. 6A and 8A, the insulation layer 112 may cover the first common source region 108a, the first drain region 110a and the plurality of first cell source/drain regions 106a. As shown in FIGS. 7A and 8A, the insulation layer 112 may cover the second common source region 108b, the second drain region 110b and the plurality of second cell source/drain regions 106b.

In one embodiment, the insulation layer 112 may be formed by depositing an insulating material such as an oxide by any suitable process followed by planarizing the deposited insulating material (e.g., by an etchback process, a chemical-mechanical polishing process, or the like or a combination thereof). As a result of planarizing the deposited insulating material, the insulation layer 112 may have a substantially planar upper surface over the semiconductor substrate 100. However, the insulation layer 112 may be planarized in a later processing step.

A source groove 114s, a plurality of first landing holes 114a and a plurality of second landing holes 114b may be defined within the insulation layer 112. For example, a source groove 114s may extend along the "y" direction within the insulation layer 112 to expose the first common source region 108a and the second common source region 108b of each of the plurality of first active regions 104a and second active regions 104b, respectively.

As shown in FIGS. 6A and 8A, each of the plurality of first landing holes 114a may be defined within the insulation layer 112 to expose the first drain region 110a of a corresponding one of the plurality of first active regions 104a. As shown in FIGS. 7A and 8A, each of the plurality of second landing holes 114b may be defined within the insulation layer 112 to expose the second drain region 110b of a corresponding one of the plurality of second active regions 104b.

In one embodiment, the source groove 114s, the plurality of first landing holes 114a and the plurality of second landing holes 114b may be formed simultaneously. In another embodiment, however, the source groove 114s may be formed before or after the plurality of first landing holes 114a and the plurality of second landing holes 114b are formed.

In some embodiments, the first landing holes 114a and the plurality of second landing holes 114b are formed in a single row along the "y" direction. However, the first landing holes 114a and the second landing holes 114b may be formed in an offset manner or zigzag manner as described above.

Referring to FIGS. 6B, 7B and 8B, a common source line 116s, a plurality of first cell landing plugs 116a and a plurality of second cell landing plugs 116b may then be formed within the source groove 114s, the plurality of first landing holes 114a and the plurality of second landing holes 114b, respectively, to extend through the insulation layer 112. For example, the common source line 116s may extend along the "y" direction within the insulation layer 112 to be electrically connected to the first common source region 108a and the second common source region 108b of each of the plurality of first active regions 104a and second active regions 104b, respectively. As shown in FIGS. 6B and 8B, each of the plurality of first cell landing plugs 116a may be electrically connected to the first drain region 110a of a corresponding one of the plurality of first active regions 104a. As shown in FIGS. 7B and 8B, each of the plurality of second cell landing plugs 116*b* may be defined within the insulation layer 112 to be electrically connected to the second drain region 110*b* of a corresponding one of the plurality of second active regions 104*b*.

In one embodiment, the common source line 116*s*, the plurality of first cell landing plugs 116*a* and the plurality of second cell landing plugs 116*b* may be formed by forming a conductive material (not shown) over the insulation layer 112 and within the source groove 114*s*, the plurality of first landing holes 114*a* and the plurality of second landing holes 114*b*. An upper portion of the conductive material may then be removed (e.g., by an etchback process, a chemical-mechanical polishing process, or the like or a combination thereof) until an upper surface of the insulation layer 112 is exposed.

In one embodiment, the upper surfaces of the common source line 116*s*, the plurality of first cell landing plugs 116*a* and the plurality of second cell landing plugs 116*b* may be substantially coplanar with the upper surface of the insulation layer 112. Upon exposing the upper surface of the insulation layer 112, the common source line 116*s*, the plurality of first cell landing plugs 116*a* and the plurality of second cell landing plugs 116*b* are formed.

Accordingly, the common source line 116*s*, the plurality of first cell landing plugs 116*a* and the plurality of second cell landing plugs 116*b* may be formed simultaneously. In another embodiment, however, the common source line 116*s* may be formed before or after the plurality of first cell landing plugs 116*a* and the plurality of second cell landing plugs 116*b* are formed.

Subsequently, a first interlayer dielectric 118 may be formed over the insulation layer 112, the common source line 116*s*, the plurality of first cell landing plugs 116*a* and the plurality of second cell landing plugs 116*b*. In one embodiment, the first interlayer dielectric 118 may be formed by depositing an insulating material such as an oxide by any suitable process followed by planarizing the deposited insulating material (e.g., by an etchback process, a chemical-mechanical polishing process, or the like or a combination thereof). As a result of planarizing the deposited insulating material, the first interlayer dielectric 118 may have a substantially planar upper surface over the insulation layer 112.

As shown in FIGS. 6B and 8B, a plurality of first contact holes 120 may be defined within the first interlayer dielectric 118. For example, a first contact hole 120 may extend within the first interlayer dielectric 118 to expose a corresponding one of the plurality of first cell landing plugs 116*a*.

In one embodiment, the plurality of first contact holes 120 may be defined within the first interlayer dielectric 118 according to a photolithographic patterning process. For example, a photoresist pattern (not shown) may be formed on the upper surface of the first interlayer dielectric 118 and the first interlayer dielectric 118 may be selectively removed (e.g., etched) using the photoresist pattern as a mask.

Subsequently, a plurality of first cell contact plugs 122 may be formed within the plurality of first contact holes 120, to extend through the first interlayer dielectric 118. As shown in FIGS. 6B and 8B, each of the plurality of first cell contact plugs 122 may be electrically connected to a corresponding one of the plurality of first cell landing plugs 116*a*.

In one embodiment, the plurality of first cell contact plugs 122 may be formed by forming a conductive material (not shown) over the first interlayer dielectric 118 and within the plurality of first contact holes 120. An upper portion of the conductive material may then be removed (e.g., by an etchback process, a chemical-mechanical polishing process, or the like or a combination thereof) until an upper surface of the first interlayer dielectric 118 is exposed. Upon exposing the upper surface of the first interlayer dielectric 118, the plurality of first cell contact plugs 122 are formed.

As discussed above, the width of the lower portion of the first contact hole 120 may be greater than the width of the upper portion of the first cell landing plug 116*a* along the "x" direction. On the contrary, the width of the lower portion of the first contact hole 120 may be less than the width of the upper portion of the first cell landing plug 116*a* along the "x" direction as shown in FIG. 3. In addition, the first cell contact plugs 122 may be formed as described in FIG. 4. For example, the first cell contact plug 122 may be tapered from the top to the bottom thereof.

Referring to FIGS. 6C and 8C, a plurality of first cell bit lines 124 may then be formed over the first interlayer dielectric 118 and the plurality of first cell contact plugs 122. For example, the plurality of first cell bit lines 124 may extend substantially parallel to one another along the "x" direction and be spaced apart from one another along the "y" direction. Accordingly, the plurality of first cell bit lines 124 may extend parallel with each of the plurality of first active regions 104*a*. As shown in FIGS. 6C and 8C, each of the plurality of first cell bit lines 124 may be electrically connected to a corresponding one of the plurality of first cell contact plugs 122.

In one embodiment, the plurality of first cell bit lines 124 may be formed by forming a conductive material (not shown) over the first interlayer dielectric 118 and on the plurality of first cell contact plugs 122. The conductive material may then be patterned using, for example, a photolithographic patterning process in which a photoresist pattern (not shown) is formed on the upper surface of the conductive material and the conductive material is selectively removed (e.g., etched) using the photoresist pattern as a mask. Upon etching the conductive material, the plurality of first cell bit lines 124 are formed.

Subsequently, a second interlayer dielectric 126 may be formed over the first interlayer dielectric 118 and the plurality of first cell bit lines 124 using conventional methods. As shown in FIG. 8C, a plurality of second contact holes 128 may be defined within the second interlayer dielectric 126 and the first interlayer dielectric 118 between the plurality of first cell bit lines 124. For example, a second contact hole 128 may extend within the second interlayer dielectric 126 and the first interlayer dielectric 118 to expose a corresponding one of the plurality of second cell landing plugs 116*b* without being stopped by conductive pads.

Subsequently, a plurality of second cell contact plugs 130 may be formed within the plurality of second contact holes 128 using conventional techniques, to extend all the way through the second interlayer dielectric 126 and the first interlayer dielectric 118 before they contact the second cell landing plugs 116*b*. In other words, the second cell contact plugs 130 may directly contact the second cell landing plugs 116*b*.

In one embodiment, the plurality of second cell contact plugs 130 may be formed by forming a conductive material (not shown) over the second interlayer dielectric 126 and within the plurality of second contact holes 128. An upper portion of the conductive material may then be removed (e.g., by an etchback process, a chemical-mechanical polishing process, or the like or a combination thereof) until an upper surface of the second interlayer dielectric 126 is exposed. Upon exposing the upper surface of the second interlayer dielectric 126, the plurality of second cell contact plugs 130 are formed. In one embodiment, the upper surfaces of the plurality of second cell contact plugs 130 may be substantially coplanar with the upper surface of the second interlayer dielectric 126.

Subsequently, and with reference to FIGS. 2B and 2C, a plurality of second cell bit lines 132 may then be formed over second interlayer dielectric 126 and the plurality of second cell contact plugs 130. For example, the plurality of second cell bit lines 132 may extend substantially parallel to one another along the "x" direction and be spaced apart from one another along the "y" direction. Accordingly, the plurality of second cell bit lines 132 may extend parallel with each of the plurality of second active regions 104b. As shown in FIGS. 2B and 2C, each of the plurality of second cell bit lines 132 may be electrically connected to a corresponding one of the plurality of second cell contact plugs 130 and then coupled to the second drain 110 via the second cell landing plug 116b as discussed above.

In one embodiment, the plurality of second cell bit lines 132 may be formed by forming a conductive material (not shown) over the second interlayer dielectric 118 and on the plurality of second cell contact plugs 130. The conductive material may then be patterned using, for example, a photolithographic patterning process in which a photoresist pattern (not shown) is formed on the upper surface of the conductive material and the conductive material is selectively removed (e.g., etched) using the photoresist pattern as a mask. Upon etching the conductive material, the plurality of second cell bit lines 132 are formed.

Figure 9:
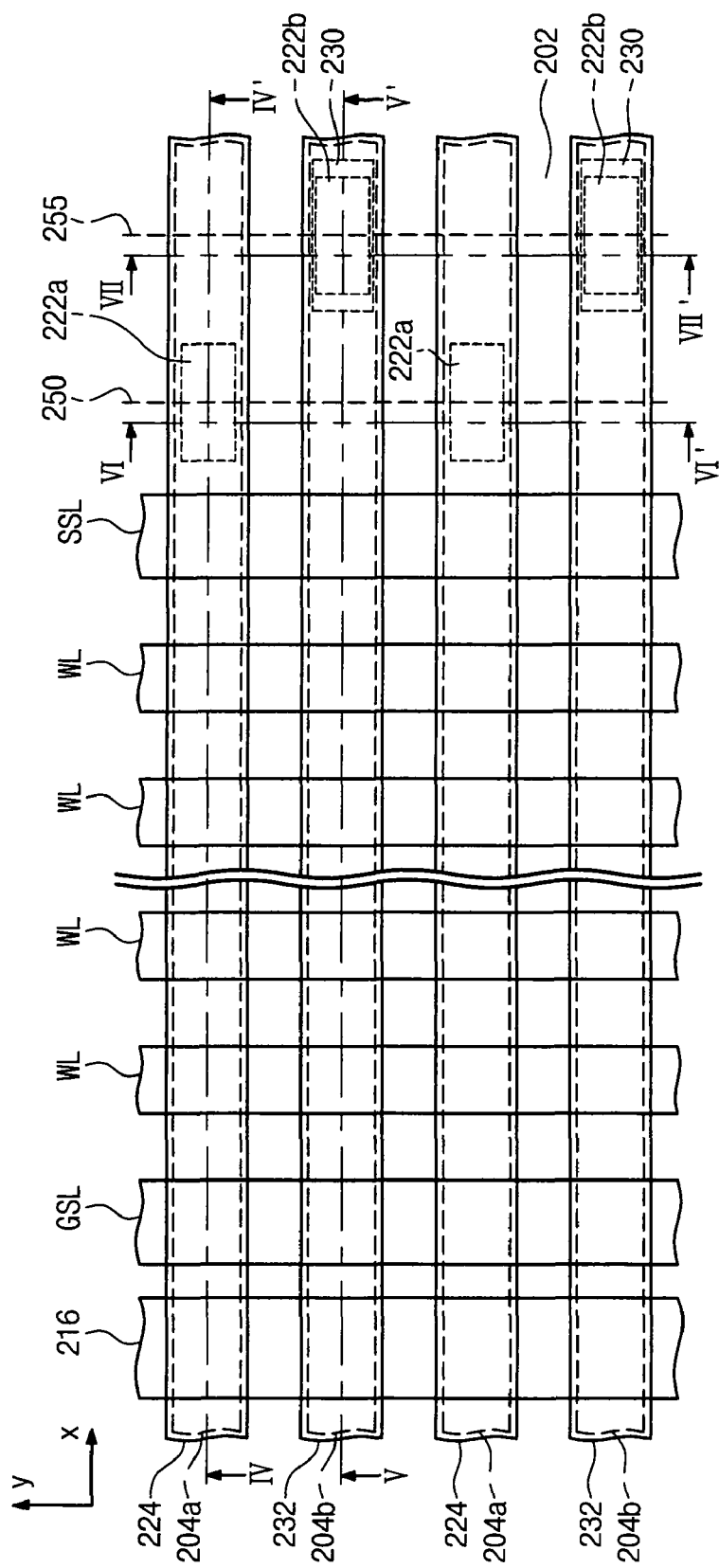
FIG. 9 is a plan view of a semiconductor memory device according to yet another embodiment.

FIG. 9 is a plan view of a semiconductor memory device according to yet another embodiment.

Referring to FIG. 9, a semiconductor memory device according to another embodiment may be provided as similarly described above with respect to FIG. 1. For the sake of brevity, only the differences between the embodiment described above with respect to FIG. 1 and the embodiment shown in FIG. 9 will be discussed.

In contrast with FIG. 2, according to the embodiment exemplarily illustrated in FIG. 9, the semiconductor memory device may include a plurality of first cell landing plugs 222a contacting the first drain region 210a and a corresponding one of the plurality of first bit lines 224 without contact plugs. Thus, the first bit lines 224 directly contact the first cell landing plugs 222a. An exemplary structure of the first cell landing plugs 222a will be described in greater detail with respect to FIGS. 10A and 10C. Accordingly, a first drain region 210a of each of the plurality of first active regions 104a can be electrically connected to a corresponding one of the plurality of first bit lines 224 via a "first conductive structure" including only a first cell landing plug 222a.

Also shown in FIG. 9 are a plurality of second cell landing plugs 222b and a plurality of second cell contact plugs 230. Similar to the embodiment described above with respect to FIG. 1, each of the plurality of second cell landing plugs 222b may contact a second drain region 210b of a corresponding one of the plurality of second active regions 104b and each of the plurality of second cell contact plugs 230 may contact a second cell landing plug 222b and a corresponding one of the plurality of second cell bit lines 132. Differences between the plurality of second cell landing plugs 222b and the plurality of second cell landing plugs 116b (and between the plurality of second cell contact plugs 230 and the plurality of second cell contact plugs 130) will be more apparent with reference to FIGS. 10B and 10D. In detail, the second cell landing plugs 222b extend through both a first interlayer dielectric 218 and the insulation layer 212 and the second cell contact plugs 230 extend through a second interlayer dielectric 226.

Accordingly, a second drain region 210b of each of the plurality of second active regions 104b can be electrically connected to a corresponding one of the plurality of second cell bit lines 132 via a "second conductive structure" including a second cell landing plug 222b and a second cell contact plug 230 electrically connected thereto.

Additionally, as described above with respect to FIG. 1, each of the plurality of first conductive structures may be substantially aligned with each of the plurality of second conductive structures along the "y" direction. Accordingly, a virtual line extending along the "y" direction may conceptually bifurcate the first and second conductive structures at substantially middle portions thereof. According to the embodiment exemplarily illustrated in FIG. 9, however, the plurality of first conductive structures may be offset from the plurality of second conductive structures along the "y" direction, i.e., the direction that the bit line 224 extends Accordingly, a first virtual line 150 extending along the "y" direction may conceptually bifurcate the each of the first conductive structures at substantially middle portions thereof and a second virtual line 155 extending along the "y" direction may conceptually bifurcate the each of the second conductive structures at substantially middle portions thereof.

In one embodiment, the plurality of first conductive structures may be offset from the plurality of second conductive structures along the "y" direction such that the first virtual line 150 does not intersect any of the plurality of second conductive structures and such that the second virtual line 155 does not intersect any of the plurality of first conductive structures.

It will be appreciated, however, that each of the plurality of first conductive structures may be substantially aligned with each of the plurality of second conductive structures along the "y" direction.

FIGS. 10A, 10B, 10C and 10D are cross-sectional views illustrating the semiconductor memory device shown in FIG. 9, taken along lines IV-IV', V-V', VI-VI' and VII-VII' of FIG. 9, respectively, according to some embodiments.

Referring generally to FIGS. 10A, 10B, 10C and 10D, the semiconductor memory device may be provided as similarly described above with respect to FIGS. 2A, 2B and 2C. For the sake of brevity, only the differences between the embodiment described above with respect to FIGS. 2A, 2B and 2C and the embodiment shown in FIGS. 10A, 10B, 10C and 10D will be discussed.

Figure 10A:
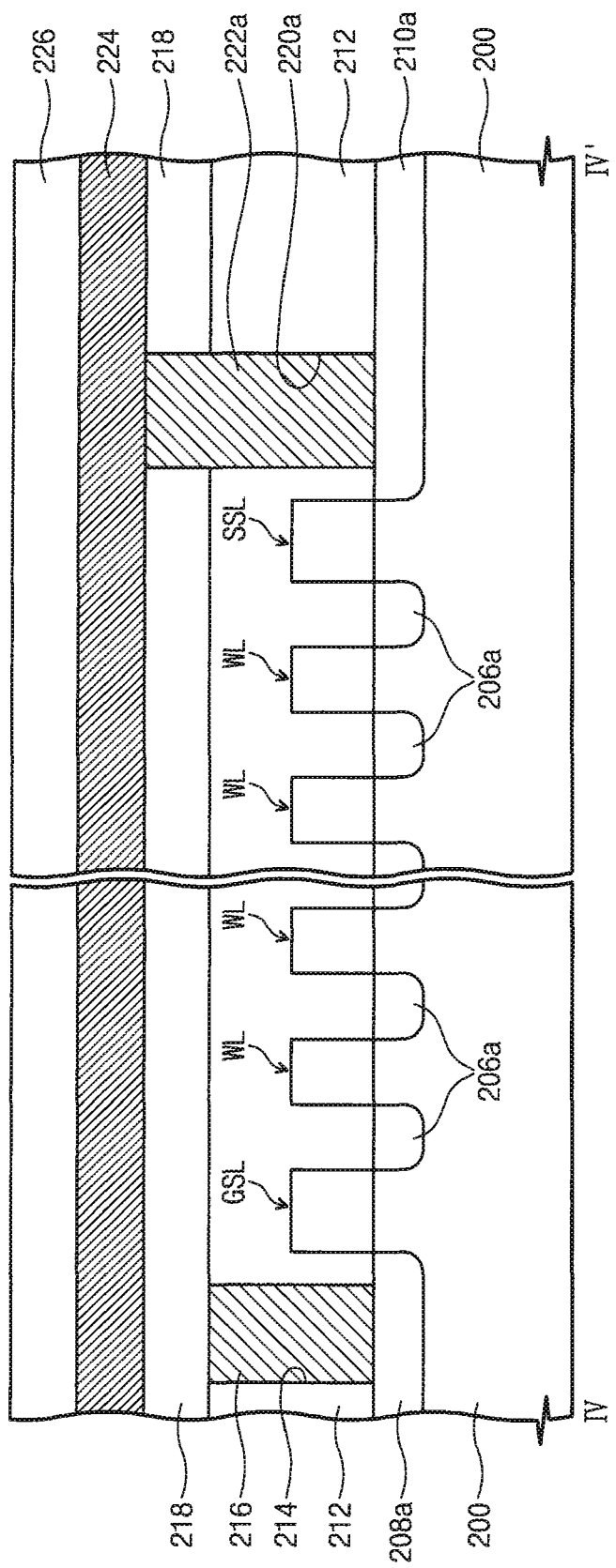
FIGS. 10A, 10B, 10C and 10D are cross-sectional views illustrating the semiconductor memory device shown in FIG. 9, taken along lines IV-IV', V-V', VI-VI' and VII-VII' of FIG. 9, respectively, according to some embodiments.
Figure 10B:
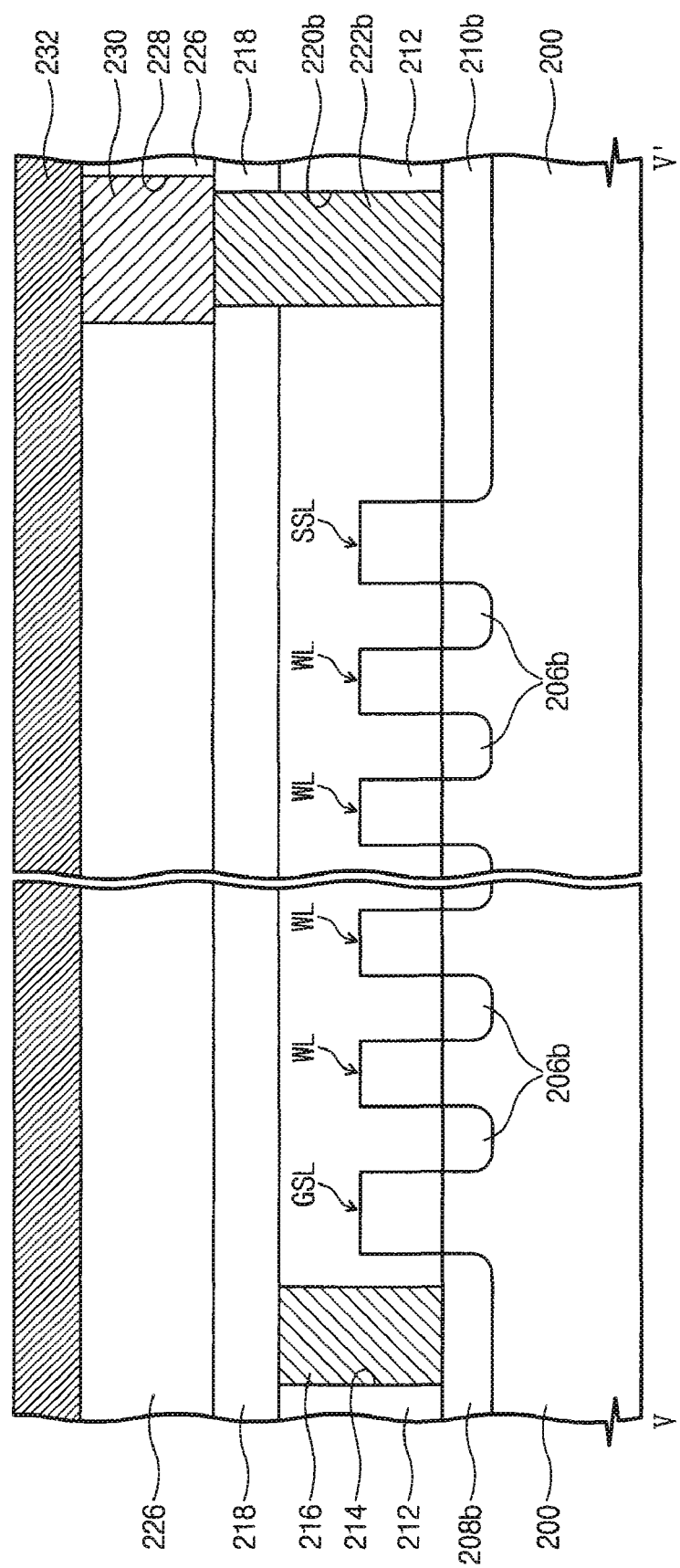
Figure 10C:
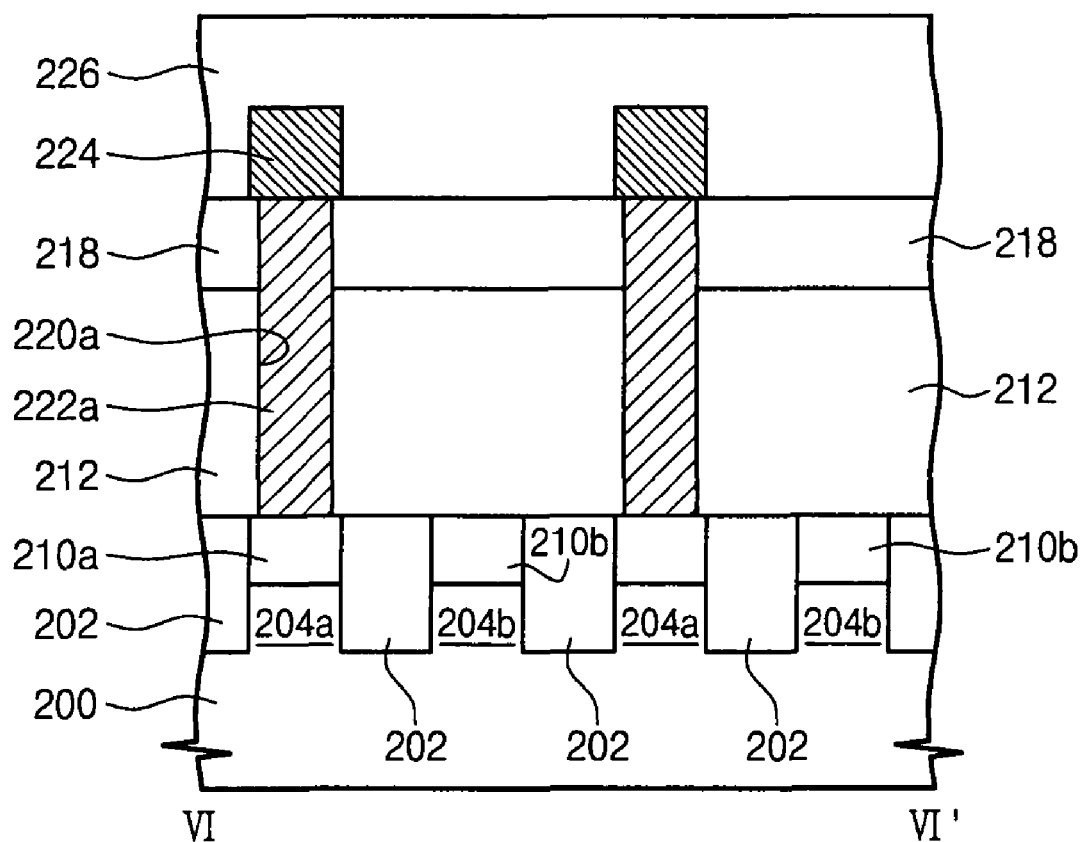

As exemplarily shown in FIGS. 10A and 10C, each of the plurality of first cell landing plugs 222a may contact a first drain region 210a of a corresponding one of the plurality of first active regions 204a and a corresponding one of the plurality of first cell bit lines 224.

In one embodiment, each of the plurality of first cell landing plugs 222a may successively extend through the insulation layer 212 and the first interlayer dielectric 218. For example, each of the plurality of first cell landing plugs 222a may be disposed within a corresponding first landing hole 220a defined in the insulation layer 212 and the first interlayer dielectric 218 so as to extend through the insulation layer 212 and the first interlayer dielectric 218 without being stopped by a conductive pad until it reaches a first drain 210a. Accordingly, the first drain region 210a of each of the plurality of first active regions 204a can be electrically connected to a corresponding one of the plurality of first cell bit lines 224 via a "first conductive structure" including the first cell landing plug 222a.

Further, in FIG. 10C, which is a cross-sectional view of the memory device shown in FIG. 9, taken along line, VI-VI', the first or second conductive structure is not formed on a second drain region 210b as the first and second conductive structures discussed are formed in a zigzag manner, in contrast with the embodiment shown in FIG. 8C.

Figure 10D:
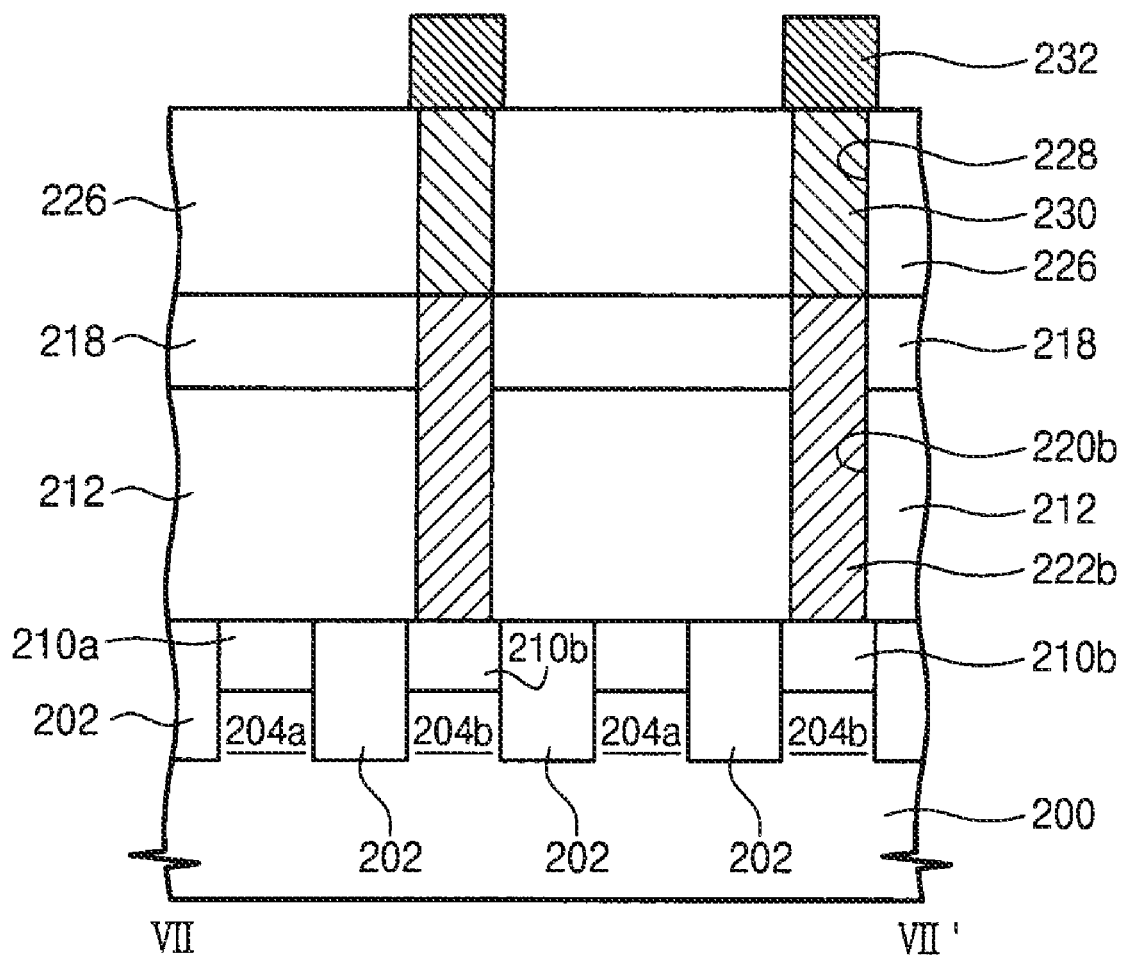

As exemplarily shown in FIGS. 10B and 10D, each of the plurality of second cell landing plugs 222b may contact a second drain region 210b of a corresponding one of the plurality of second active regions 204b and each of the plurality of second cell contact plugs 230 may contact a second cell landing plug 222b and a corresponding one of the plurality of second cell bit lines 232.

In one embodiment, upper surfaces of the plurality of second cell landing plugs 222b may be substantially coplanar with the upper surface of the first interlayer dielectric 218. In another embodiment, each of the plurality of second cell landing plugs 222b may extend through the insulation layer 212 and the first interlayer dielectric 218. For example, each of the plurality of second cell landing plugs 222b may be disposed within a corresponding second landing hole 220b defined in the insulation layer 212 and the first interlayer dielectric 218 so as to extend through the insulation layer 212 and the first interlayer dielectric 218.

In another embodiment, each of the plurality of second cell contact plugs 230 may extend through the second interlayer dielectric 226. For example, each of the plurality of second cell contact plugs 230 may be disposed within a corresponding second contact hole 228 defined in the second interlayer dielectric 226.

Accordingly, a second drain region 210b of each of the plurality of second active regions 204b can be electrically connected to a corresponding one of the plurality of second cell bit lines 232 via a "second conductive structure" including a second cell landing plug 222b and a second cell contact plug 230 electrically connected thereto, wherein the second conductive structure extends through the second interlayer dielectric 226 and the first interlayer dielectric 218.

Constructed as exemplarily described above with respect to FIGS. 9, 10A, 10B, 10C and 10D lateral distances between the plurality of first cell bit lines 124 and adjacent ones of the plurality of second cell contact plugs 230 may be significantly increased, even when the device geometries of the semiconductor memory device decrease. As a result, undesirable effects of coupling capacitances between bit lines, conventionally observed during programming of the memory cells included in the semiconductor memory device, may be substantially reduced.

Figure 11A:
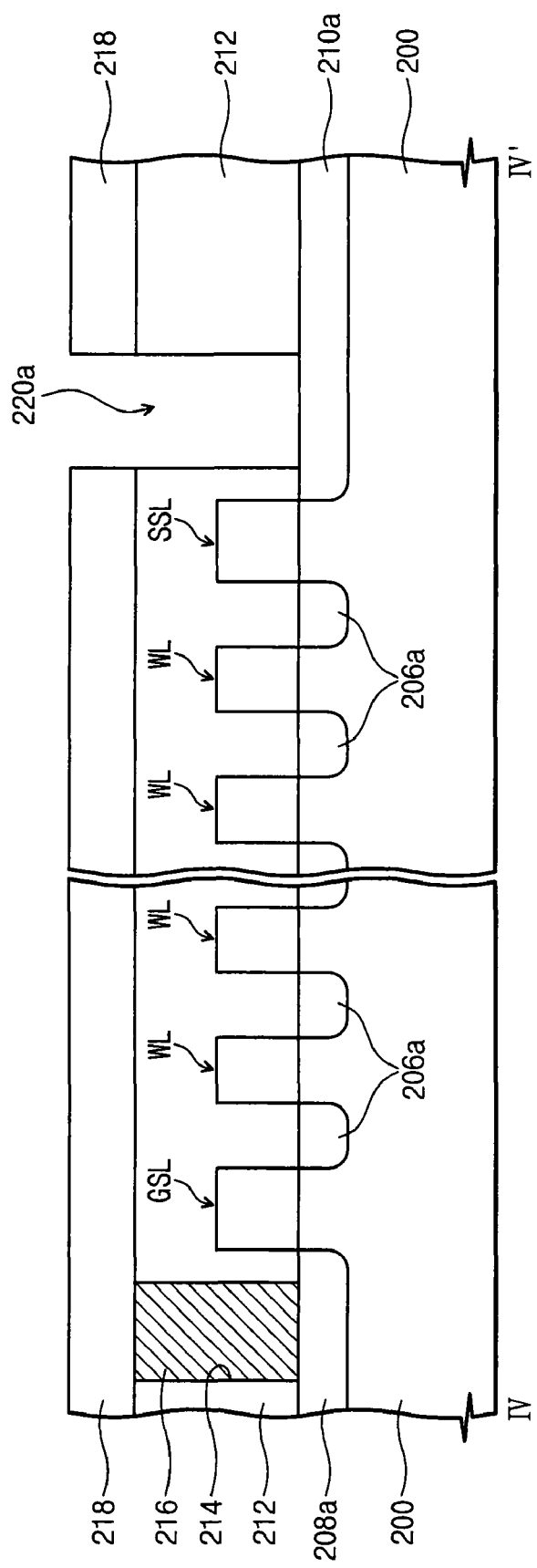
FIGS. 11A and 11B are cross-sectional views illustrating a method of forming the semiconductor memory device shown in FIG. 9, taken along line IV-IV' of FIG. 9, according to one embodiment.
Figure 11B:
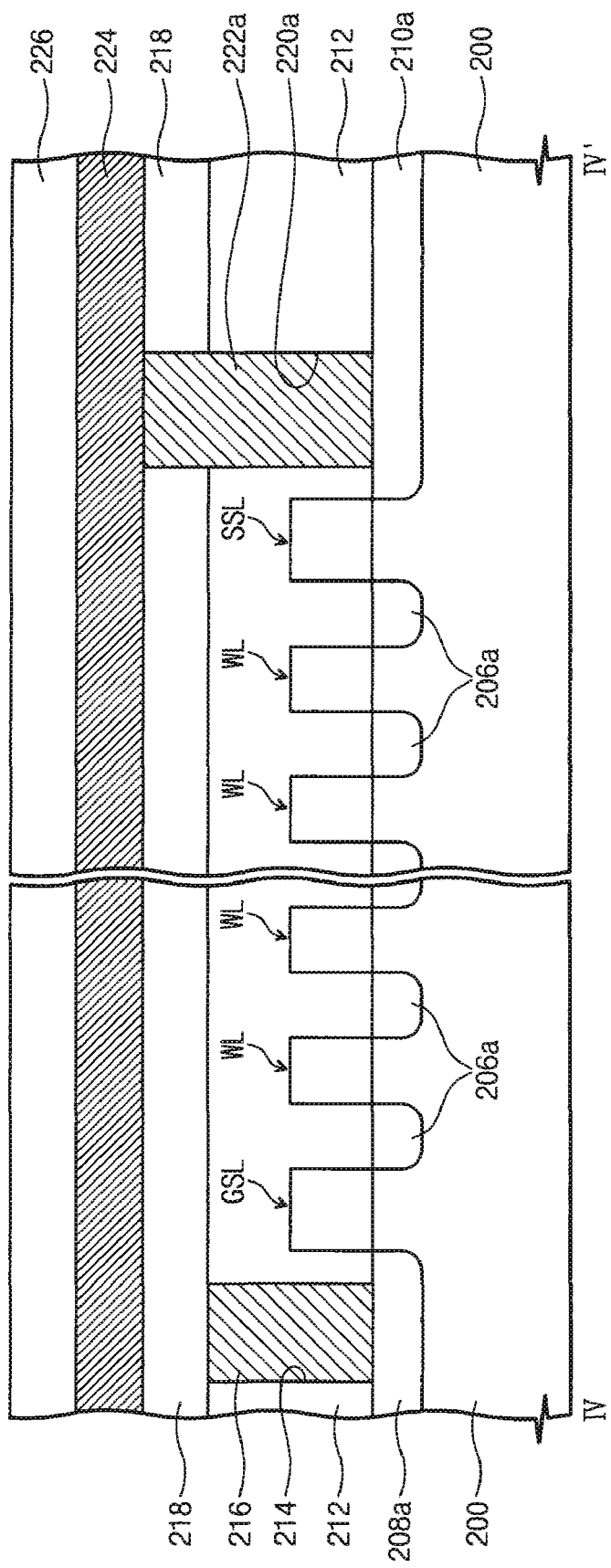
Figure 12A:
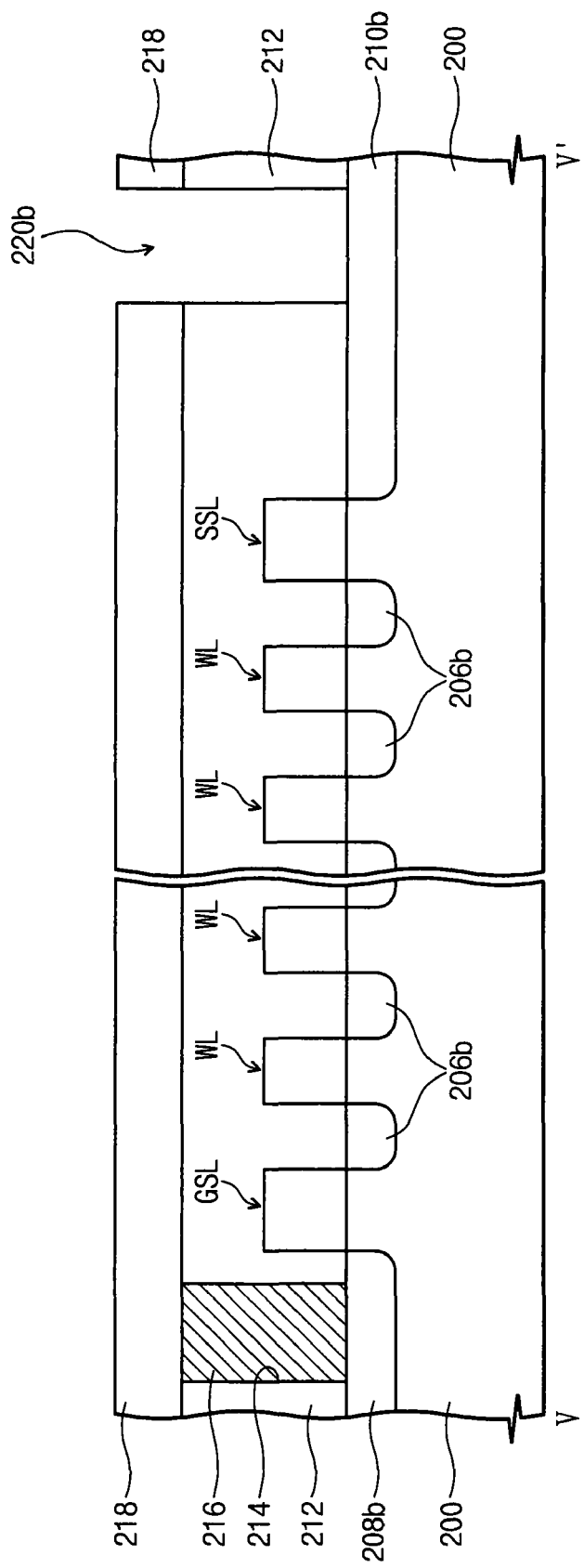
FIGS. 12A and 12B are cross-sectional views illustrating a method of forming the semiconductor memory device shown in FIG. 9, taken along line V-V' of FIG. 9, according to one embodiment.
Figure 12B:
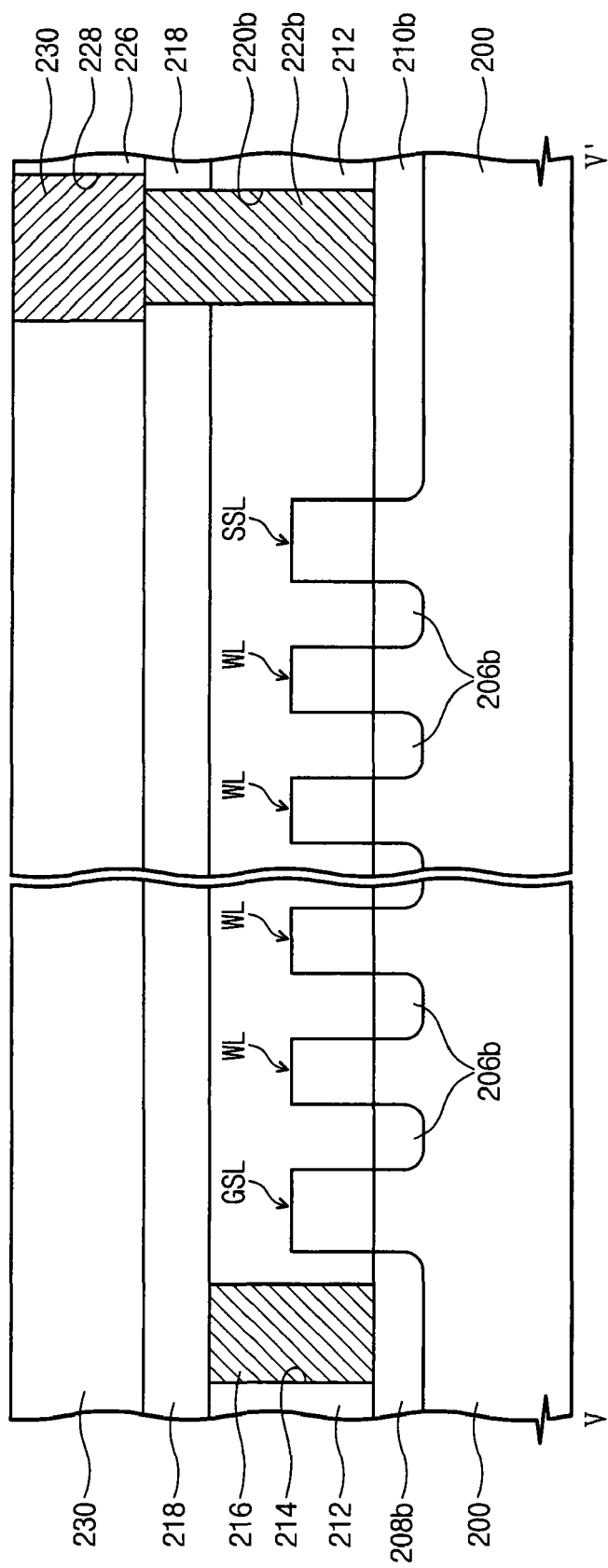
Figure 13A:
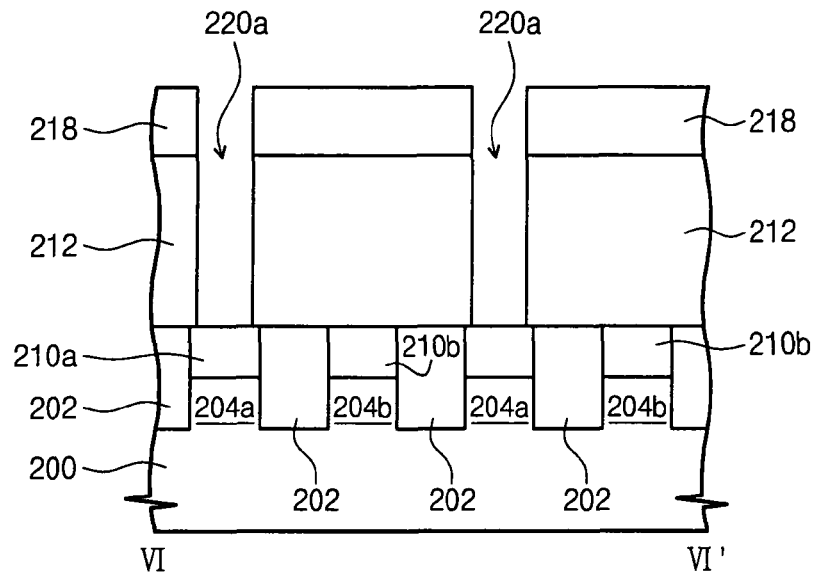
FIGS. 13A and 13B are cross-sectional views illustrating a method of forming the semiconductor memory device shown in FIG. 9, taken along line VI-VI' of FIG. 9, according to one embodiment.
Figure 13B:
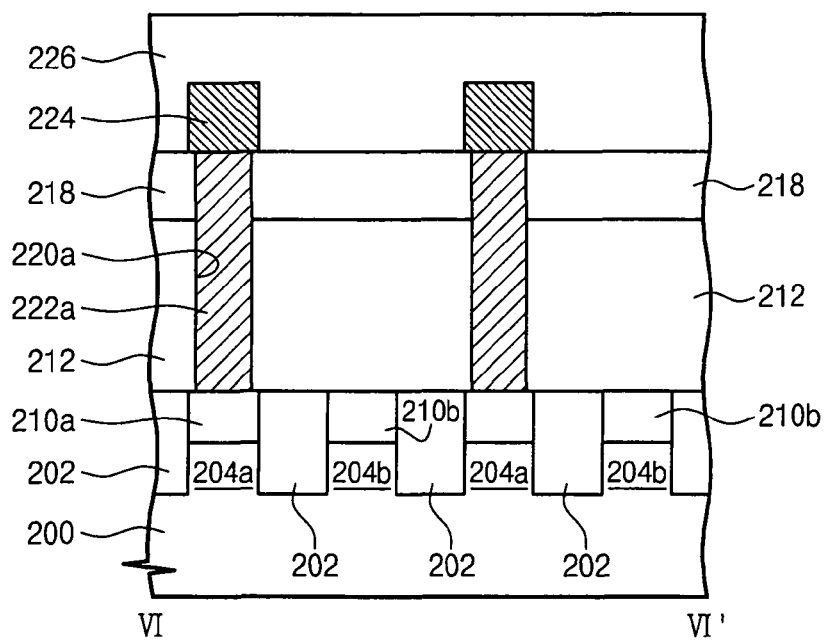
Figure 14A:
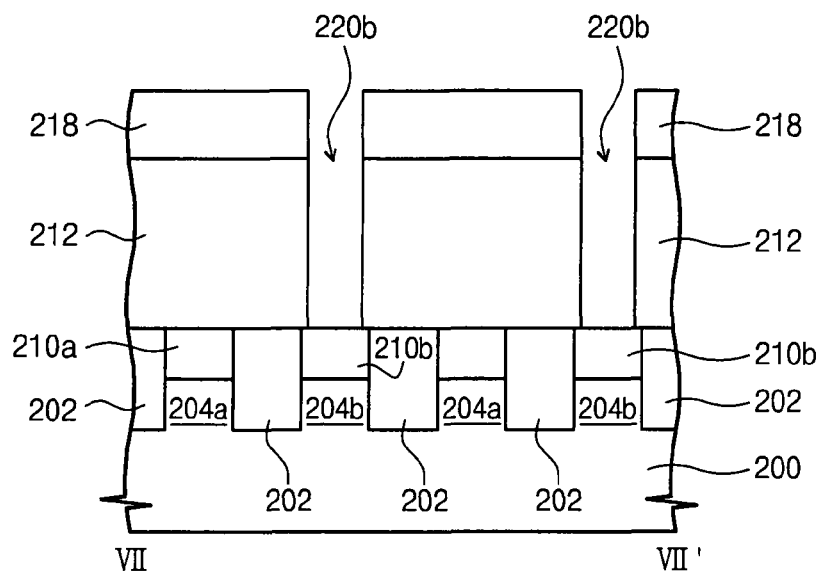
FIGS. 14A and 14B are cross-sectional views illustrating a method of forming the semiconductor memory device shown in FIG. 9, taken along line VII-VII' of FIG. 9, according to one embodiment.
Figure 14B:
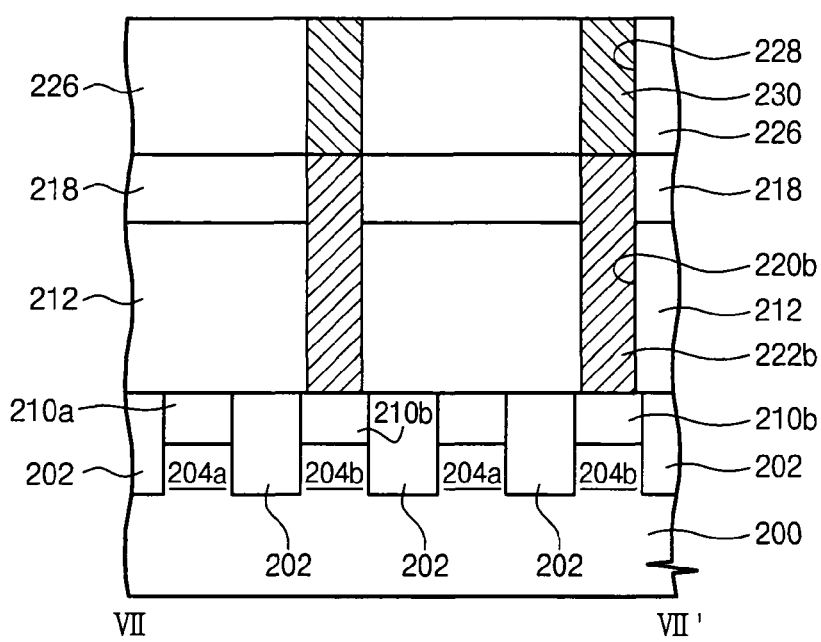

FIGS. 11A and 11B are cross-sectional views illustrating a method of forming the semiconductor memory device shown in FIG. 9, taken along line IV-IV' of FIG. 9, according to one embodiment. FIGS. 12A and 12B are cross-sectional views illustrating a method of forming the semiconductor memory device shown in FIG. 9, taken along line V-V' of FIG. 9, according to one embodiment. FIGS. 13A and 13B are cross-sectional views illustrating a method of forming the semiconductor memory device shown in FIG. 9, taken along line VI-VI' of FIG. 9, according to one embodiment. FIGS. 14A and 14B are cross-sectional views illustrating a method of forming the semiconductor memory device shown in FIG. 9, taken along line VII-VII' of FIG. 9, according to one embodiment.

For the sake of brevity, only the differences between the methods exemplarily described above with respect to FIGS. 6A-8C and the method exemplarily describe with respect to FIGS. 11A through 14B will be discussed.

Referring to FIGS. 11A, 12A, 13A and 14A, an insulation layer 212 may be formed over the semiconductor substrate 200 on which the device isolation pattern 202 defining the plurality of first active regions 204a and the plurality of second active regions 204b, the ground select line GSL, the plurality of word lines WL, the string select lines SSL, the plurality of first common source regions 208a, the plurality of second common source regions 208b, the plurality of first drain regions 210a and the plurality of second drain regions 210b are formed. In one embodiment, the insulation layer 212 may have a substantially planar upper surface over the semiconductor substrate 200.

A source groove 214s may be defined within the insulation layer 212. For example, a source groove 214s may extend along the "y" direction within the insulation layer 212 to expose the first common source region 208a and the second common source region 208b of each of the plurality of first active regions 204a and second active regions 204b, respectively.

In one embodiment, the source groove 214s may be defined within the insulation layer 212 according to a photolithographic patterning process. For example, a photoresist pattern (not shown) may be formed on the upper surface of the insulation layer 212 and the insulation layer 212 may be selectively removed (e.g., etched) using the photoresist pattern as a mask. Upon etching the insulation layer 212, the source groove 214s is formed.

Subsequently, a common source line 216 may be formed within the source groove 214 to extend through the insulation layer 212. For example, the common source line 216 may extend along the "y" direction within the insulation layer 212 to be electrically connected to the first common source region 208a and the second common source region 208b of each of the plurality of first active regions 204a and second active regions 204b, respectively. In one embodiment, the upper surface of the common source line 216 may be substantially coplanar with the upper surface of the insulation layer 212.

A first interlayer dielectric 218 may then be formed over the insulation layer 212 and the common source line 216. In one embodiment, the first interlayer dielectric 218 may have a substantially planar upper surface over the insulation layer 212 and the common source line 216.

Subsequently, a plurality of first landing holes 220a and a plurality of second landing holes 220b may be defined within the insulation layer 212 and the first interlayer dielectric 218. As shown in FIGS. 11A and 13A, each of the plurality of first landing holes 220a may be defined within the insulation layer 212 and the first interlayer dielectric 218 to expose the first drain region 210a of a corresponding one of the plurality of first active regions 204a.

As shown in FIGS. 12A and 14A, each of the plurality of second landing holes 220b may be defined within the insulation layer 212 and the first interlayer dielectric 218 to expose the second drain region 210b of a corresponding one of the plurality of second active regions 204b.

In one embodiment, the plurality of first landing holes 220a and the plurality of second landing holes 220b may be defined within the insulation layer 212 and the first interlayer dielectric 218 according to a photolithographic process. Upon etching the first interlayer dielectric 218 and the insulation layer 212, the plurality of first landing holes 220a and the plurality of second landing holes 220b are formed.

Referring to FIGS. 11B, 12B, 13B and 14B, a plurality of first cell landing plugs 222a and a plurality of second cell landing plugs 222b may then be formed within the plurality of first landing holes 220a and the plurality of second landing holes 220b, respectively, to extend through the insulation layer 212 and the first interlayer dielectric 218.

In this embodiment, consequently, the plurality of first cell landing plugs 222a or the plurality of second landing plugs 222b extend through the insulation layer 212 and the first interlayer dielectric 218 while the common source line 216 merely extends through the insulation layer 212, the top surface of the first cell landing plug 222a or the top surface of the second cell landing plug 222b is above a top surface of the common source line 216.

As shown in FIGS. 11B and 13B, each of the plurality of first cell landing plugs 222a may be electrically connected to the first drain region 210a. As shown in FIGS. 12B and 14B, each of the plurality of second cell landing plugs 222b may be electrically connected to the second drain region 210b. In one embodiment, the upper surfaces of the plurality of first cell landing plugs 222a and the plurality of second cell landing plugs 222b may be substantially coplanar with the upper surface of the first interlayer dielectric 218.

Subsequently, a plurality of first cell bit lines 224 may be formed over first interlayer dielectric 218 and the plurality of first cell landing plugs 222a. As shown in FIGS. 11B and 13B, each of the plurality of first cell bit lines 224 may be electrically connected to a corresponding one of the plurality of first cell contact plugs 222.

A second interlayer dielectric 226 may then be formed over the first interlayer dielectric 218 and the plurality of first cell bit lines 224.

As shown in FIGS. 12B and 14B, a plurality of second contact holes 228 may be defined within the second interlayer dielectric 226. For example, a second contact hole 228 may extend within the second interlayer dielectric 226 to expose a corresponding one of the plurality of second cell landing plugs 222b.

Subsequently, a plurality of second cell contact plugs 230 may be formed within the plurality of second contact holes 228, to extend through the second interlayer dielectric 126. As shown in FIGS. 12B and 14B, each of the plurality of second cell contact plugs 230 may be electrically connected to a corresponding one of the plurality of second cell landing plugs 222b. In one embodiment, the upper surfaces of the plurality of second cell contact plugs 230 may be substantially coplanar with the upper surface of the second interlayer dielectric 126.

Referring to FIGS. 10B and 10D, a plurality of second cell bit lines 132 may then be formed over second interlayer dielectric 126 and the plurality of second cell contact plugs 230. Each of the plurality of second cell bit lines 132 may be electrically connected to a corresponding one of the plurality of second cell contact plugs 230.

Figure 15:
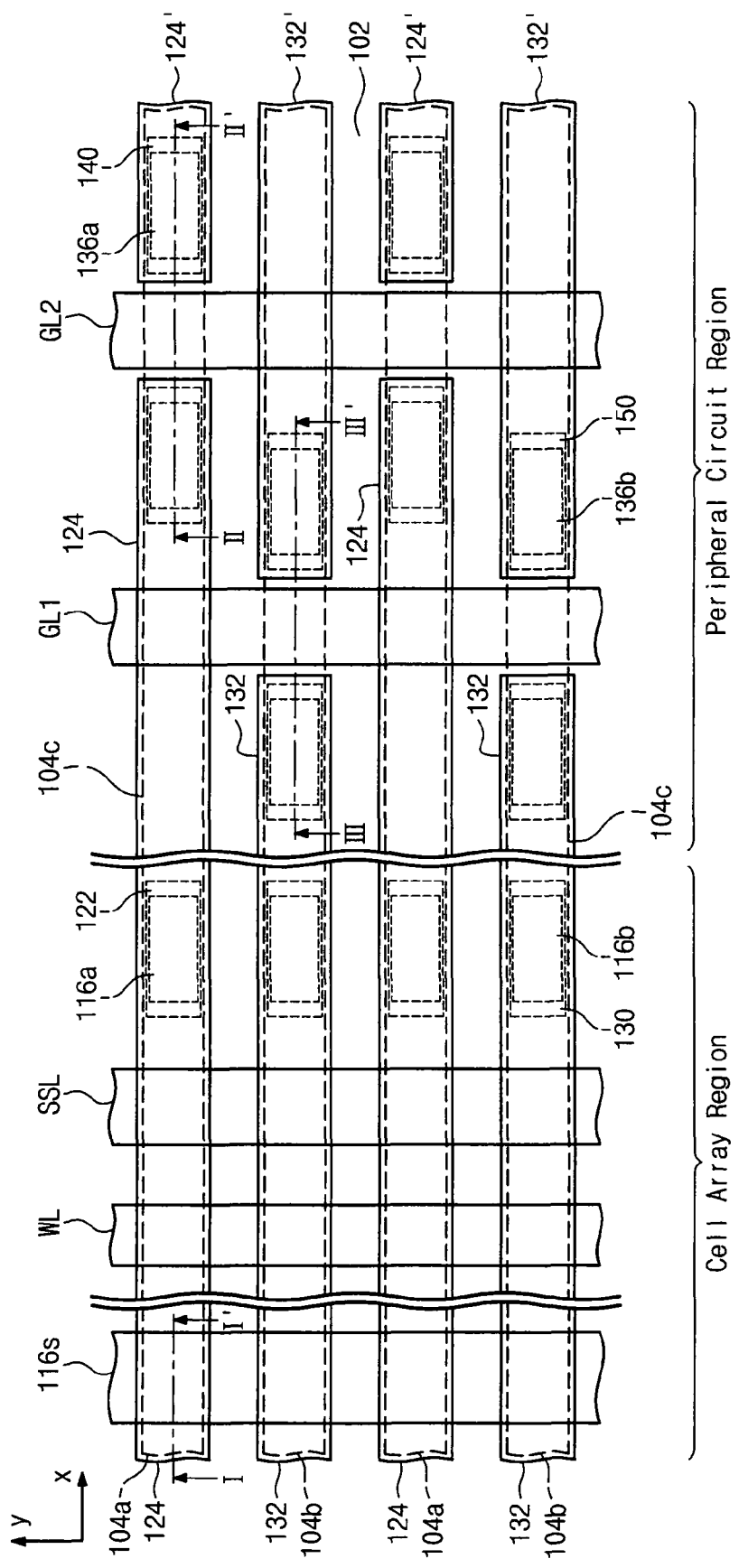
FIG. 15 is a plan view of a semiconductor memory device according to still another embodiment.

FIG. 15 is a plan view of a semiconductor memory device according to still another embodiment.

Referring to FIG. 15, the semiconductor device described above with respect to FIG. 1 may further include a peripheral circuit region. The peripheral circuit region may contain devices adapted to control programming operations (e.g., reading, writing, erasing of data) of the memory cells within the cell array region.

In one embodiment, the device isolation pattern 102 may define a plurality of third active regions 104c within a semiconductor substrate 100 in a similar manner as the device isolation pattern 102 defines the plurality of first active regions 104a and the plurality of second active regions 104b discussed above with respect to FIG. 1. In other words, the plurality of third active regions 104c may be portions of the semiconductor substrate 100 surrounded by the isolation pattern 102.

The peripheral circuit region may further include a plurality of gate lines GL extending, for example, substantially parallel to each other along the "y" direction and spaced apart from each other along the "x" direction. Accordingly, the plurality of gate lines GL may cross over predetermined ones of the plurality of third active regions 104c.

Also shown in FIG. 15 are a plurality of first peripheral landing plugs 136a, a plurality of second peripheral landing plugs 136b, a plurality of first peripheral contact plugs 140 and a plurality of second peripheral contact plugs 150. The first peripheral landing plugs 136a and second peripheral landing plugs 136b may be collectively referred to herein as "third landing plugs." Likewise, the first peripheral contact plugs 140 and second peripheral contact plugs 150 may be collectively referred to herein as "third contact plugs."

As will be discussed in greater with respect to FIGS. 16A, 16B and 16C, each of the plurality of third landing plugs may contact a peripheral source/drain region of a corresponding one of the plurality of third active regions 104c and each of the plurality of third contact plugs may contact a third landing plug and a corresponding one of the plurality of first cell bit lines 124 or a corresponding one of the plurality of second cell bit lines 132. Accordingly, a peripheral source/drain region of each of the plurality of third active regions 104c can be electrically connected to a corresponding one of the plurality of first cell bit lines 124 or a corresponding one of the plurality of second cell bit lines 132 via a "third conductive structure" that includes a third landing plug and a third contact plug electrically connected thereto.

In one embodiment, each of the plurality of first peripheral landing plugs 136a and second peripheral landing plugs 136b may include a material such as that described above with respect to the plurality of first cell landing plugs 116a and second peripheral landing plugs 116b. In another embodiment, each of the plurality of first peripheral landing plugs 136a and second peripheral landing plugs 136b may be formed of the same material from which the plurality of first cell landing plugs 116a and second peripheral landing plugs 116b are formed.

In one embodiment, each of the plurality of first peripheral contact plugs 140 and second peripheral contact plugs 150 may include a material such as that described above with respect to the plurality of first cell contact plugs 122 and second cell contact plugs 130. In another embodiment, each of the plurality of first peripheral contact plugs 140 and second peripheral contact plugs 150 may be formed of the same material from which the plurality of first cell contact plugs 122 and second cell contact plugs 130 are formed.

As exemplarily shown in FIG. 15, the plurality of first cell bit lines 124 and the plurality of second cell bit lines 132 extend along the "x" direction from the memory cell region to the peripheral circuit region. In one embodiment, the plurality of first cell bit lines 124 and the plurality of second cell bit lines 132 that extend from the cell array region may be electrically connected to corresponding ones of the third contact plugs.

In another embodiment, the metallization layer(s) used to form the plurality of first cell bit lines 124 and the plurality of second cell bit lines 132 may be used as interconnection structures which are electrically connected to third/source drain regions 106c of the peripheral circuit region. For example, a first peripheral bit line 124' may be electrically connected to third source/drain region 106c via a third conductive structure including the first peripheral landing plug 136a and the first peripheral contact plug 140. Similarly, a second peripheral bit line 132' may be electrically connected to third source/drain region 106c via the third conductive structure including the second peripheral landing plug 136b and the second peripheral contact plug 150.

In one embodiment, the first peripheral bit line 124' may be formed of the same metallization layer(s) as the first cell bit line 124. In another embodiment, the second peripheral bit line 132' may be formed of the same metallization layer(s) as the second cell bit line 132. The first peripheral bit lines 124' and second peripheral bit lines 132' may be collectively referred to herein as "third bit lines."

Figure 16A:
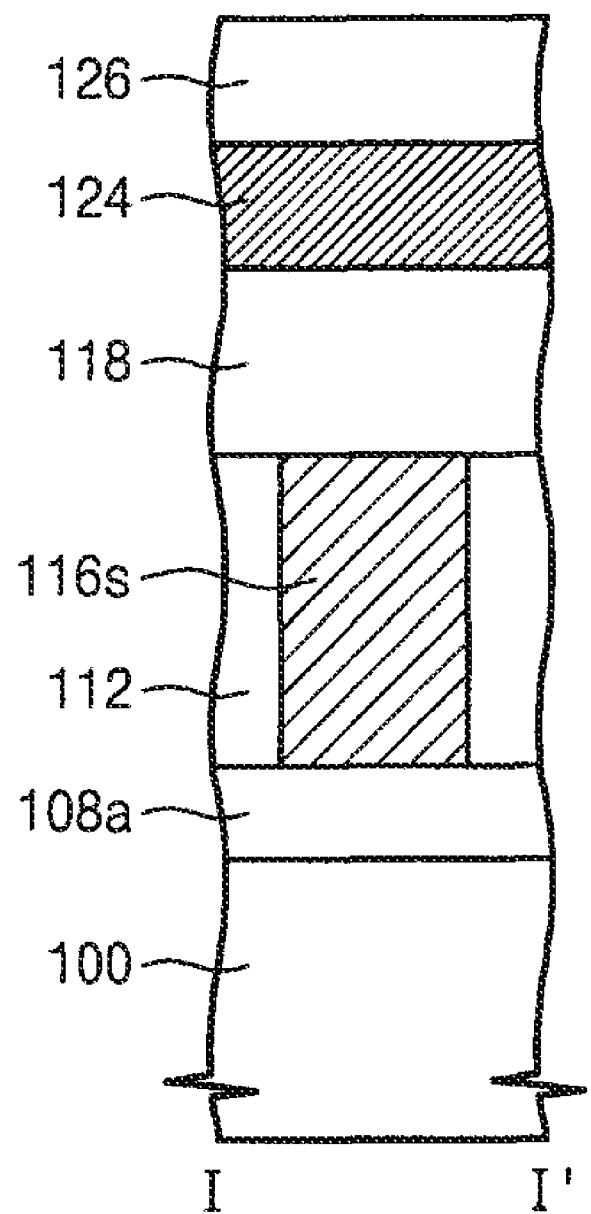
FIGS. 16A, 16B and 16C are cross-sectional views illustrating the semiconductor memory device shown in FIG. 15, taken along lines I-I', II-II' and III-III' of FIG. 15, respectively, according to some embodiments.
Figure 16B:
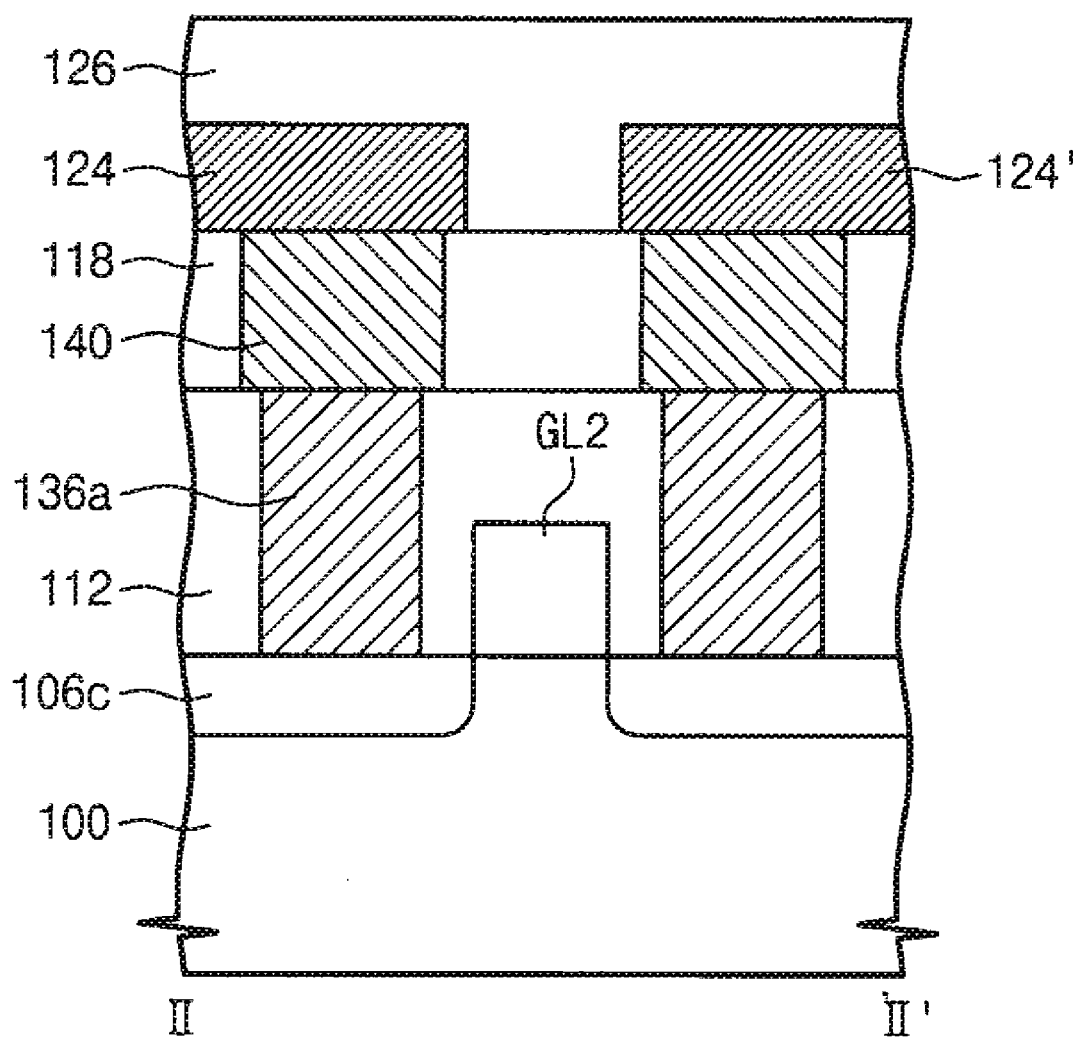
Figure 16C:
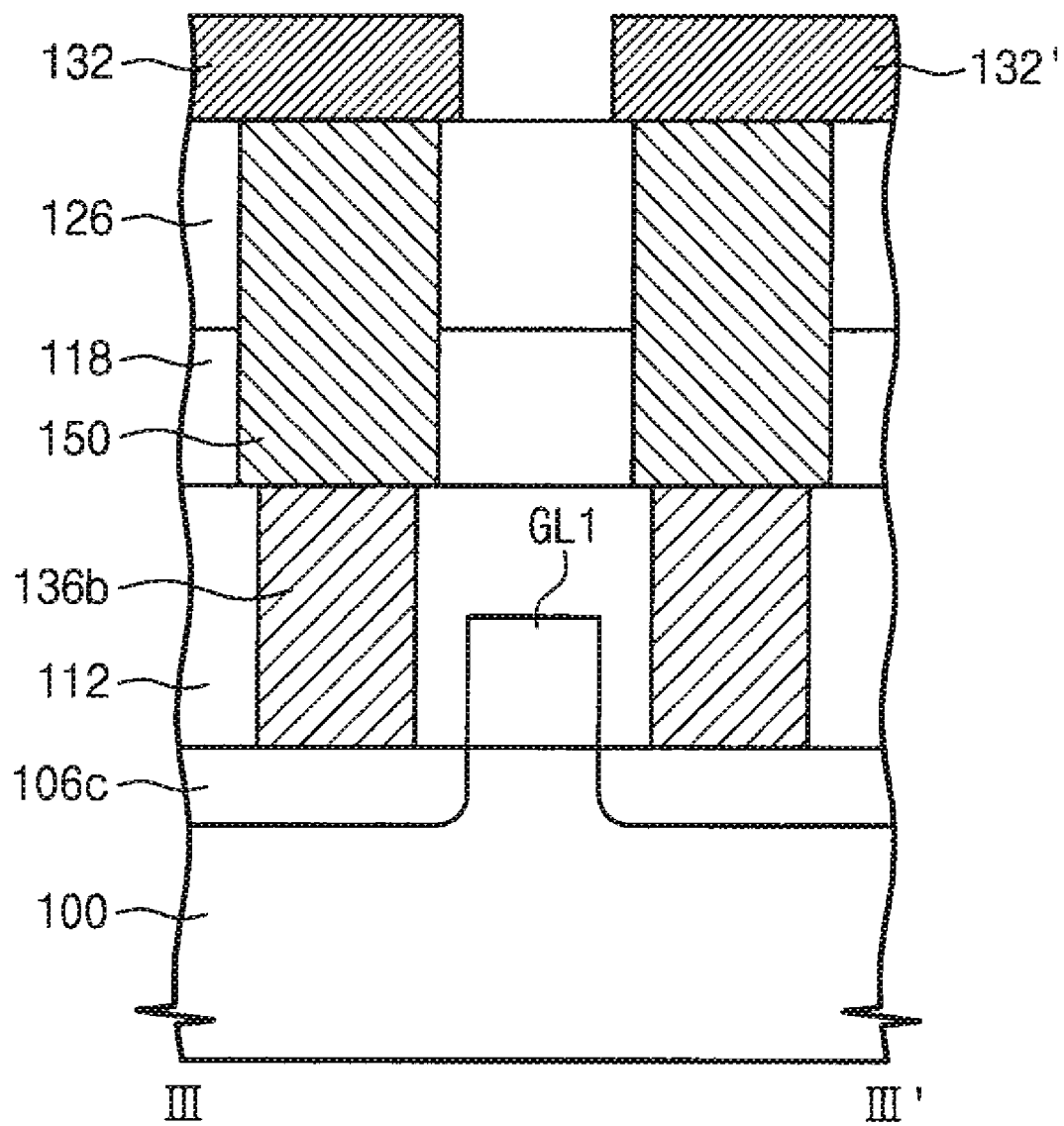

FIGS. 16A, 16B and 16C are cross-sectional views illustrating the semiconductor memory device shown in FIG. 15, taken along lines I-I', II-II' and III-III' of FIG. 15, respectively, according to some embodiments.

Referring generally to FIGS. 16B and 16C, the insulation layer 112 may be formed over the semiconductor substrate 100 and on each of the plurality of third active regions 104c, the first interlayer dielectric 118 may be located on the insulation layer 112 and over each of the plurality of third active regions 104c, and the second interlayer dielectric 126 may be located on the first interlayer dielectric 118 and also on the first cell bit lines 124.

As also shown in FIGS. 16B and 16C, each of the plurality of third active regions 104c may include a plurality of peripheral source/drain regions (also referred to herein as "third source/drain regions") 106c spaced apart from each other by the gate line (e.g., GL1 or GL2). In one embodiment, the peripheral source/drain regions 106c may include dopants of the same conductivity type as the first and second cell source/drain regions 106a and 106b, the first and second common source regions 108a and 108b and the first and second drain regions 110a and 110b.

In one embodiment, the gate lines (e.g., GL1 and GL2) extend across the plurality of third active regions 104c along the "y" direction. The gate lines are disposed between the peripheral source/drain regions 106c. In one embodiment, each gate line may include a gate electrode and a gate dielectric disposed between the gate electrode and the third active region 104c. Accordingly, a channel region may be formed below the gate electrode, between adjacent peripheral source/drain regions 106c. Each gate line may include a sidewall spacer on its sidewalls.

In one embodiment, the structures illustrated in FIGS. 16B and 16C, disposed in the peripheral circuit region of the semiconductor memory device, may be formed in a similar manner as the corresponding structures illustrated FIGS. 2A, 2B and 2C, disposed in the cell array region the semiconductor memory device are formed. For example, the insulation layer 112 may be simultaneously formed in the cell array region and the peripheral circuit region of the semiconductor substrate 100. Likewise, each of the first interlayer dielectric 118 and the second interlayer dielectric 126 may be simultaneously formed in the cell array region and the peripheral circuit region of the semiconductor substrate 100.

In one embodiment, the first peripheral landing plug 136a and the first cell landing plug 116a may be formed simultaneously, according to the same processes described above with respect to FIGS. 6A, 6B, 8A and 8B. Likewise, the second peripheral landing plug 136b and the second cell landing plug 116b may be formed simultaneously, according to the same processes described above with respect to FIGS. 7A, 7B, 8A and 8B.

In one embodiment, the first peripheral contact plug 140 and the first cell contact plug 122 may be formed simultaneously, according to the same processes described above with respect to FIGS. 6B and 8B. Likewise, the second peripheral contact plug 150 and the second contact plug 130 may be formed simultaneously, according to the same processes described above with respect to FIGS. 7B, 7C, 8B and 8C.

In one embodiment, the first peripheral bit lines 124' and the first cell bit lines 124 may be formed simultaneously, according to the same or similar processes described above with respect to FIGS. 6C and 8C. Likewise, the second peripheral bit lines 132' and the second cell bit lines 132 may be formed simultaneously, according to the same processes described above with respect to FIGS. 2B and 2C.

It will also be appreciated that, in other embodiments, any of the structures illustrated in FIGS. 15, 16B and 16C, disposed in the peripheral circuit region of the semiconductor memory device, may be formed in any suitable manner. For example, any of the peripheral landing plugs illustrated in FIGS. 15, 16B and 16C may be formed according to the processes used to form the first or second landing plugs as described above with respect to FIGS. 3-5 and 9-14B. Accordingly, in some embodiments, top surfaces of the first and second peripheral landing plugs 136a and 136b may be substantially coplanar with a top surface of the common source line 116s as shown in FIG. 16A. In other embodiments, top surfaces of the first and second peripheral landing plugs 136a and 136b may be located above the top surface of the common source line 116s. Further, any of the peripheral contact plugs illustrated in FIGS. 15, 16B and 16C may be formed according to the processes used to form the first or second contact plugs as described above with respect to FIGS. 3-5 and 9-14B.

Figure 17:
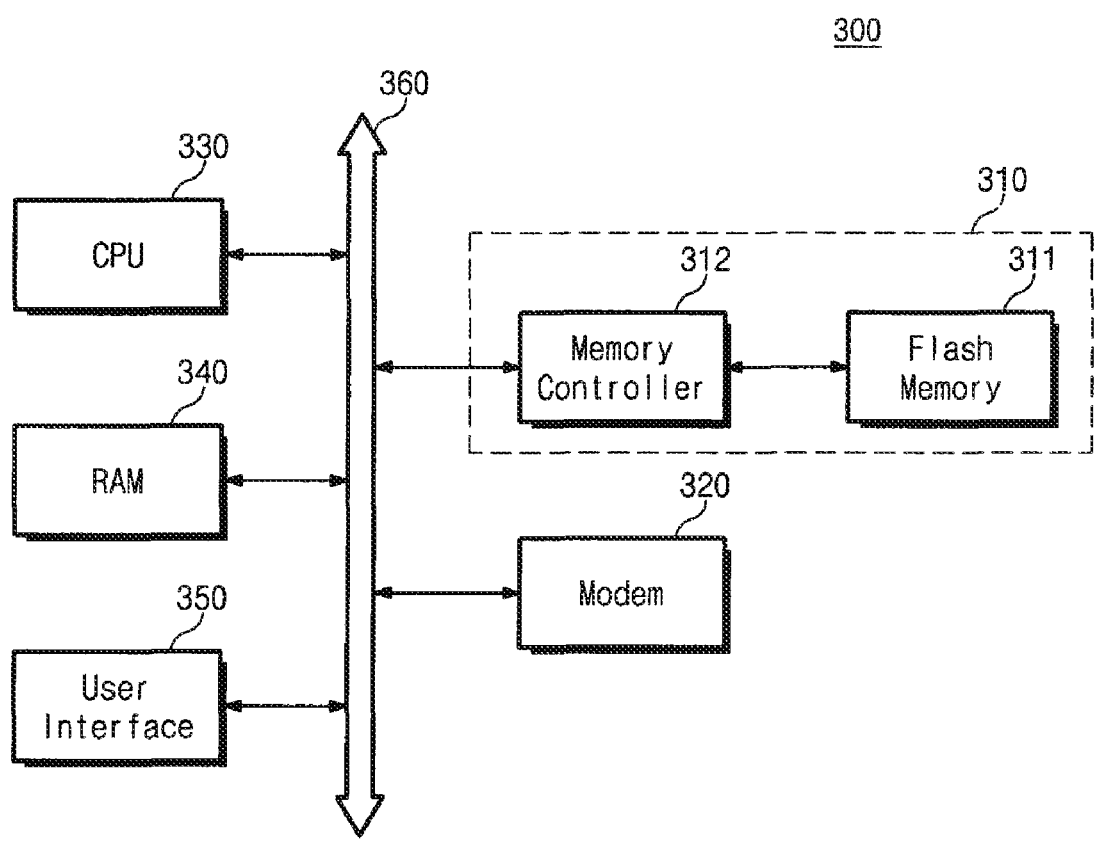
FIG. 17 is a schematic view of a memory system incorporating a semiconductor memory device, according to one embodiment.

FIG. 17 is a schematic view of a memory system incorporating a semiconductor memory device, according to one embodiment.

Referring to FIG. 17, a memory system 300 according to one embodiment includes a memory unit 310, a communication device 320 (e.g., a modem), a data processor 330 (e.g., a central processing unit (CPU)), a random access memory (RAM) unit 340 and a user interface 350. The memory unit 310, the communication device 320, the processor 330, the random access memory (RAM) unit 340 and the user interface 350 may be communicatively coupled to each other via a bus 360 such that data can be communicated through the bus 360. The memory unit 310 may include a memory device such as a flash memory 311 communicatively coupled to a memory controller 312. The memory controller 312 may be communicatively coupled to the bus 360. The memory controller 312 may be further explained in connection with FIG. 18.

In one embodiment, the flash memory 311 may be provided as a semiconductor memory device exemplarily described above.

In another embodiment, all of part of the memory system 300 can be included in a memory card, solid state disk (SSD), camera image processor (CIS), application chipset or the like. Also, the system 300 may be used in a personal digital assistant (PDA), a laptop computer, a cellular phone, a digital music system, or other various electronic devices including devices for receiving and sending information.

In yet another embodiment, the flash memory 311 or memory system 300 can be mounted in a package such as a ball grid array (BGA), a chip scale package (CSP), a plastic leaded chip carrier (PLCC), a plastic dual in-line package (PDIP), a multi-chip package (MCP), a wafer-level fabricated package (WFP), a wafer-level processed stack package (WSP), or the like.

Figure 18:
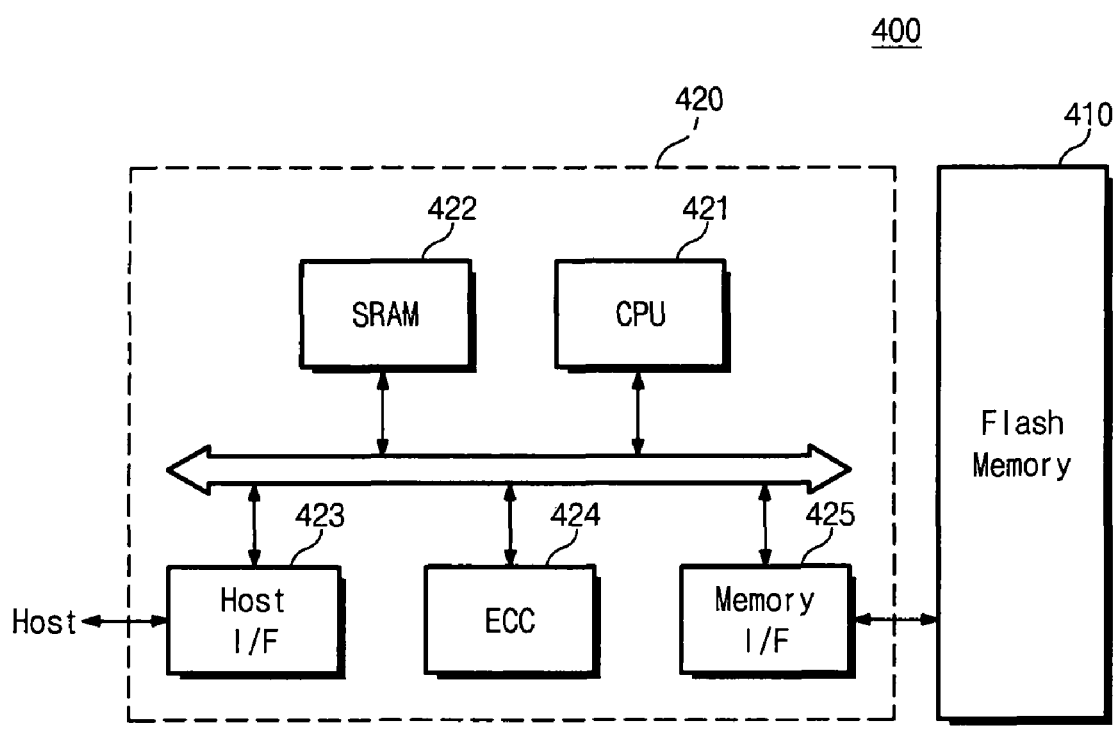
FIG. 18 is a schematic view of a memory card incorporating a semiconductor memory device, according to one embodiment.

FIG. 18 is a schematic view of a memory card incorporating a semiconductor memory device, according to one embodiment.

Referring to FIG. 18, a memory card 400 according to one embodiment includes a flash memory 410 and a memory controller 420. The memory controller 420 may control communication between the host and the flash memory 410.

In one embodiment, the memory controller 420 may include a processor 421 (e.g., a CPU), a static random access memory (SRAM) unit 422, a host interface (I/F) 423, an error correction code (ECC) module 424, and a memory interface (I/F) 425. The processor 421, the static random access memory (SRAM) unit 422, the host interface (I/F) 423, the ECC module 424, and the memory interface (I/F) 425 may be communicatively coupled to each other via a bus.

In one embodiment, the flash memory 410 may be provided as a semiconductor memory device exemplarily described above. In another embodiment, the flash memory 410 can be mounted in a package such as a ball grid array (BGA), a chip scale package (CSP), a plastic leaded chip carrier (PLCC), a plastic dual in-line package (PDIP), a multi-chip package (MCP), a wafer-level fabricated package (WFP), a wafer-level processed stack package (WSP), or the like.

Some or all of the features discussed with respect to a particular drawing or an embodiment can be also applied to other embodiments or drawings.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

While embodiments of the present invention have been particularly shown and described above, it will be understood by those of ordinary skill in the art that various changes in form and details may be made therein without departing from the spirit and scope of the present invention as defined by the following claims.

What is claimed is:

1. A semiconductor memory device, comprising:
    a device isolation pattern on a substrate defining a first active region and a second active region, wherein the first active region includes a first common source region, a plurality of first source/drain regions and a first drain region and wherein the second active region includes a second common source region, a plurality of second source/drain regions and a second drain region;
    an insulation layer overlying the first active region and the second active region;
    a common source line extending through the insulation layer and electrically connected to the first common source region and the second common source region;
    a first landing plug extending through the insulation layer and electrically connected to the first drain region;
    a second landing plug extending through the insulation layer and electrically connected to the second drain region;
    a first bit line located over the insulation layer and electrically connected to the first landing plug; and
    a second bit line located over the insulation layer and electrically connected to the second landing plug,
    wherein an upper surface of at least one of the first landing plug and the second landing plug is substantially coplanar with an upper surface of the common source line,
    wherein the first bit line and the second bit line are located at different heights above the substrate, and
    wherein the common source line extends along a plane parallel to a top surface of the substrate such that the common source line crosses over the first active region and the second active region.

2. The semiconductor device of claim 1, wherein the first and second landing plugs have substantially same height as the common source line.

3. The semiconductor device of claim 1, wherein a top surface of the insulation layer is substantially coplanar with a top surface of at least one of the first landing plug and the second landing plug.

4. The semiconductor device of claim 1, further comprising:
    a first interlayer dielectric located over the insulation layer; and
    a first contact plug extending through the first interlayer dielectric and electrically connected to the first landing plug,
    wherein the first bit line is formed on the first interlayer dielectric and is electrically connected to the first contact plug.

5. The semiconductor device of claim 4, wherein the first interlayer dielectric is located over the common source line.

6. The semiconductor device of claim 4, further comprising:
    a second interlayer dielectric located over the first interlayer dielectric; and
    a second contact plug extending through the second interlayer dielectric and the first interlayer dielectric and electrically connected to the second landing plug,
    wherein the second bit line is formed on the second interlayer dielectric and is electrically connected to the second contact plug.

7. The semiconductor device of claim 1, further comprising a first contact plug electrically connecting the first landing plug and the first bit line,
    wherein a width of a lower portion of the first contact plug is greater than a width of an upper portion of the first landing plug.

8. The semiconductor device of claim 1, further comprising a second contact plug electrically connecting the second landing plug and the second bit line,
    wherein a width of a lower portion of the second contact plug is greater than a width of an upper portion of the second landing plug.

9. The semiconductor device of claim 1, further comprising a second contact plug electrically connecting the second landing plug and the second bit line,
    wherein a width of an upper portion of the second landing plug is greater than a width of a lower portion of the second contact plug.

10. The semiconductor device of claim 1, further comprising a first contact plug electrically connecting the first landing plug and the first bit line,
    wherein a width of an upper portion of the first landing plug is greater than a width of a lower portion of the first contact plug.

11. The semiconductor device of claim 1, further comprising:
    a first contact plug electrically connecting the first landing plug and the first bit line; and
    a second contact plug electrically connecting the second landing plug and the second bit line,
    wherein at least one of the first contact plug and the second contact plug is tapered from an upper portion thereof to a lower portion thereof.

12. The semiconductor memory device of claim 1, wherein the first landing plug is substantially aligned with the second landing plug in a single row along a direction perpendicular to the bit line.

13. The semiconductor memory device of claim 1, wherein the first landing plug is offset from the second landing plug along a direction that the first bit line extends.

14. The semiconductor device of claim 1, further comprising:
- a ground select line, a plurality of word lines, and a string select line disposed on the substrate and extending parallel to each other, wherein each of the ground select line, the word lines, and the string select line crosses over the first active region and the second active region.

15. A semiconductor memory device, comprising:
- a device isolation pattern on a substrate defining a first active region and a second active region, wherein the first active region includes a first common source region and a first drain region and wherein the second active region includes a second common source region and a second drain region;
- a ground select line, a plurality of word lines, and a string select line disposed on the substrate and extending parallel to each other, wherein each of the ground select line, the word lines, and the string select line crosses over the first active region and the second active region;
- a first interlayer dielectric located over the first active region and the second active region;
- a first conductive structure extending through the first interlayer dielectric and electrically connected to the first drain region;
- a first bit line located on the first interlayer dielectric and electrically connected to the first conductive structure;
- a second interlayer dielectric located on the first interlayer dielectric, the second interlayer dielectric including a contact hole extending through the second interlayer dielectric;
- a second conductive structure disposed within the contact hole and extending through the second interlayer dielectric, wherein the second conductive structure is electrically connected to the second drain region; and
- a second bit line located on the second interlayer dielectric and electrically connected to the second conductive structure,
- wherein a width of the contact hole at a bottom surface of the second interlayer dielectric is less than or substantially equal to a width of the contact hole at a top surface of the second interlayer dielectric.

16. The semiconductor memory device of claim 15, wherein the first conductive structure is offset from the second conductive structure along a direction that the first bit line extends.

17. The semiconductor memory device of claim 16, further comprising:
- an insulation layer overlying the substrate, wherein the first interlayer dielectric is located on the insulation layer, and
- the first conductive structure is a landing plug extending through the insulation layer and the first interlayer dielectric and contacting the substrate.

18. The semiconductor memory device of claim 16, further comprising:
- an insulation layer overlying the substrate; and
- a common source line extending through the insulation layer and contacting the first common source region and the second common source region,
- wherein the first conductive structure includes a landing plug extending through the insulation layer and the first interlayer dielectric and contacting the substrate, and
- wherein the top surface of the landing plug is above a top surface of the common source line.

19. The semiconductor memory device of claim 15, further comprising a sidewall spacer within the contact hole, the sidewall spacer being located between the second conductive structure and sidewalls of the contact hole.

* * * * *